United States Patent [19]
Tsui et al.

[11] Patent Number: 5,835,405
[45] Date of Patent: Nov. 10, 1998

[54] APPLICATION SPECIFIC MODULES IN A PROGRAMMABLE LOGIC DEVICE

[75] Inventors: Cyrus Y. Tsui, Los Altos; Kapil Shankar, Fremont; Albert L. Chan, Palo Alto, all of Calif.

[73] Assignee: Lattice Semiconductor Corporation, Hillsboro, Oreg.

[21] Appl. No.: 827,671

[22] Filed: Apr. 10, 1997

Related U.S. Application Data

[63] Continuation of Ser. No. 482,316, Jun. 6, 1995, abandoned, which is a continuation of Ser. No. 166,483, Dec. 13, 1993, abandoned.

[51] Int. Cl.$^6$ ................................................. G11C 13/00
[52] U.S. Cl. ................ 365/182; 365/189.01; 365/230.01
[58] Field of Search ............................. 365/94, 103, 154, 365/182, 189.01, 230.01, 96, 185.01; 307/465, 207; 361/96

[56] References Cited

U.S. PATENT DOCUMENTS

| | | | |
|---|---|---|---|
| 4,706,216 | 11/1987 | Carter | 365/94 |
| 4,831,591 | 5/1989 | Imazeki et al. | 365/207 |
| 4,855,803 | 8/1989 | Azumai et al. | 365/96 |
| 4,872,137 | 10/1989 | Jennings, III | 364/900 |
| 5,280,202 | 1/1994 | Chan et al. | 307/465 |

FOREIGN PATENT DOCUMENTS

| | | |
|---|---|---|
| 0 410 759 A | 1/1991 | European Pat. Off. . |
| 0 509 376 A | 10/1992 | European Pat. Off. . |
| 57-055625 | 4/1982 | Japan . |

Primary Examiner—Terrell W. Fears
Attorney, Agent, or Firm—Skjerven, Morrill, MacPherson, Franklin & Friel LLP; Edward C. Kwok

[57] ABSTRACT

A structure and a method provide a programmable logic device including a number of generic logic blocks and one or more application-specific block. Such application-specific block implements a specific function, such as a register file or a memory array. In one embodiment, the application specific block is programmable to be either one or more single-port memory array, a first-in-first-out (FIFO) memory, or a dual port memory array. In another embodiment, the application-specific block can be configured to be a register file, a number of counters, a number of timers, or a shift register. The application-specific block can be used in conjunction with programmable logic arrays for multiplexing input and output signals into and out of the application-specific block. Interconnectivity between the generic logic blocks and the application-specific blocks using a global routing resource integrates into a programmable logic device functions otherwise difficult to implement using only generic logic blocks.

41 Claims, 30 Drawing Sheets

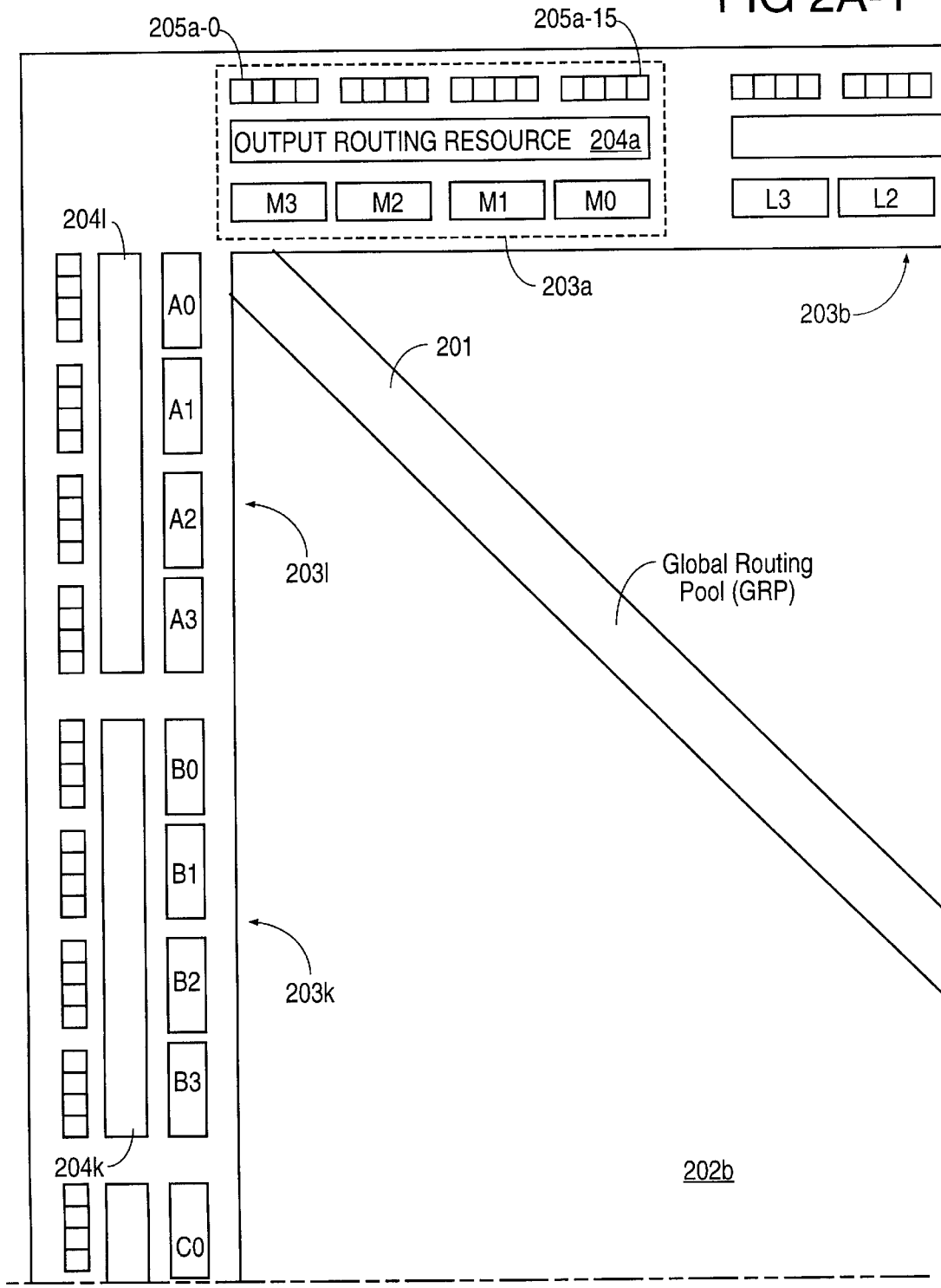

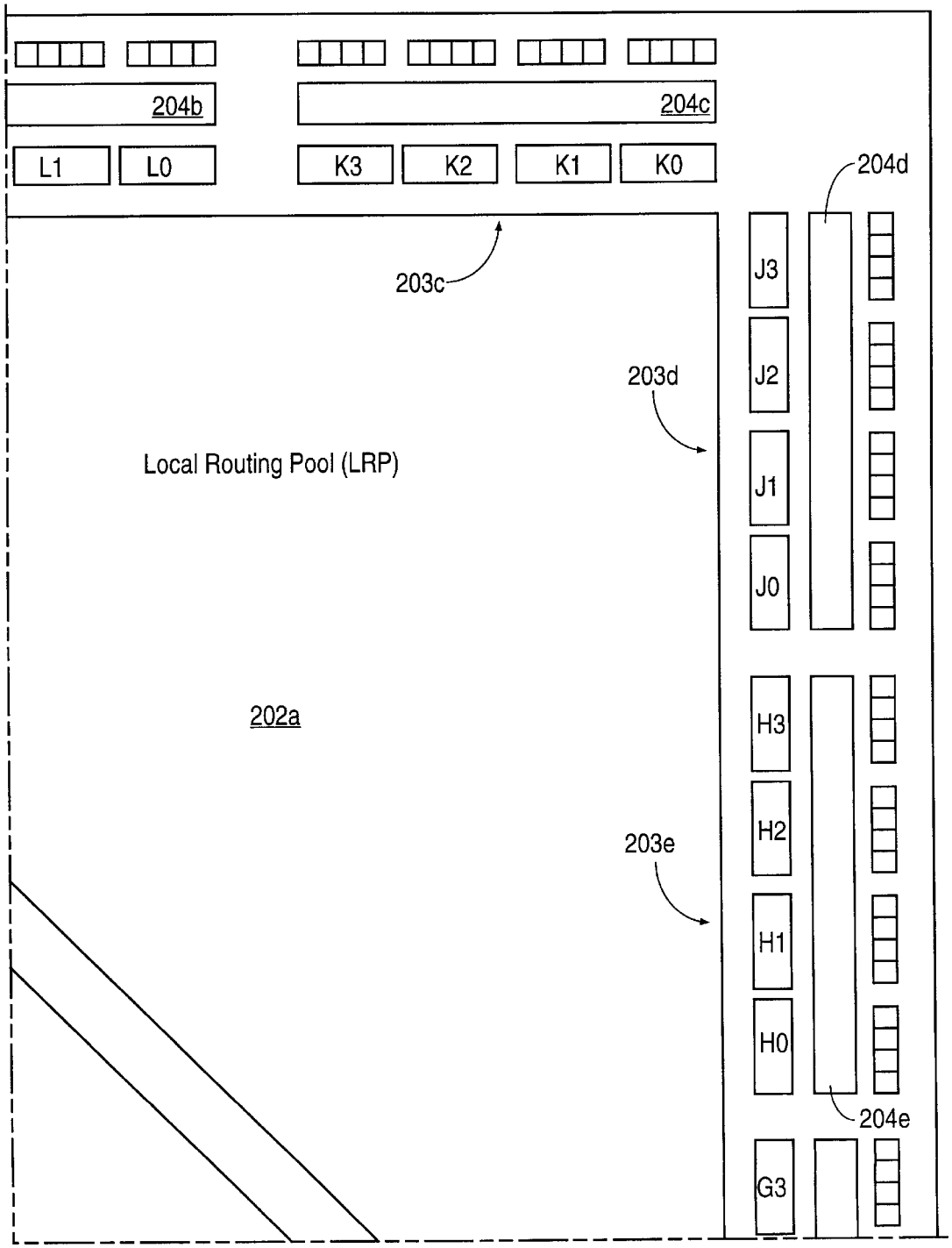

KEY TO FIG 2A

| FIG 2A-1 | FIG 2A-2 |
| --- | --- |
| FIG 2A-3 | FIG 2A-4 |

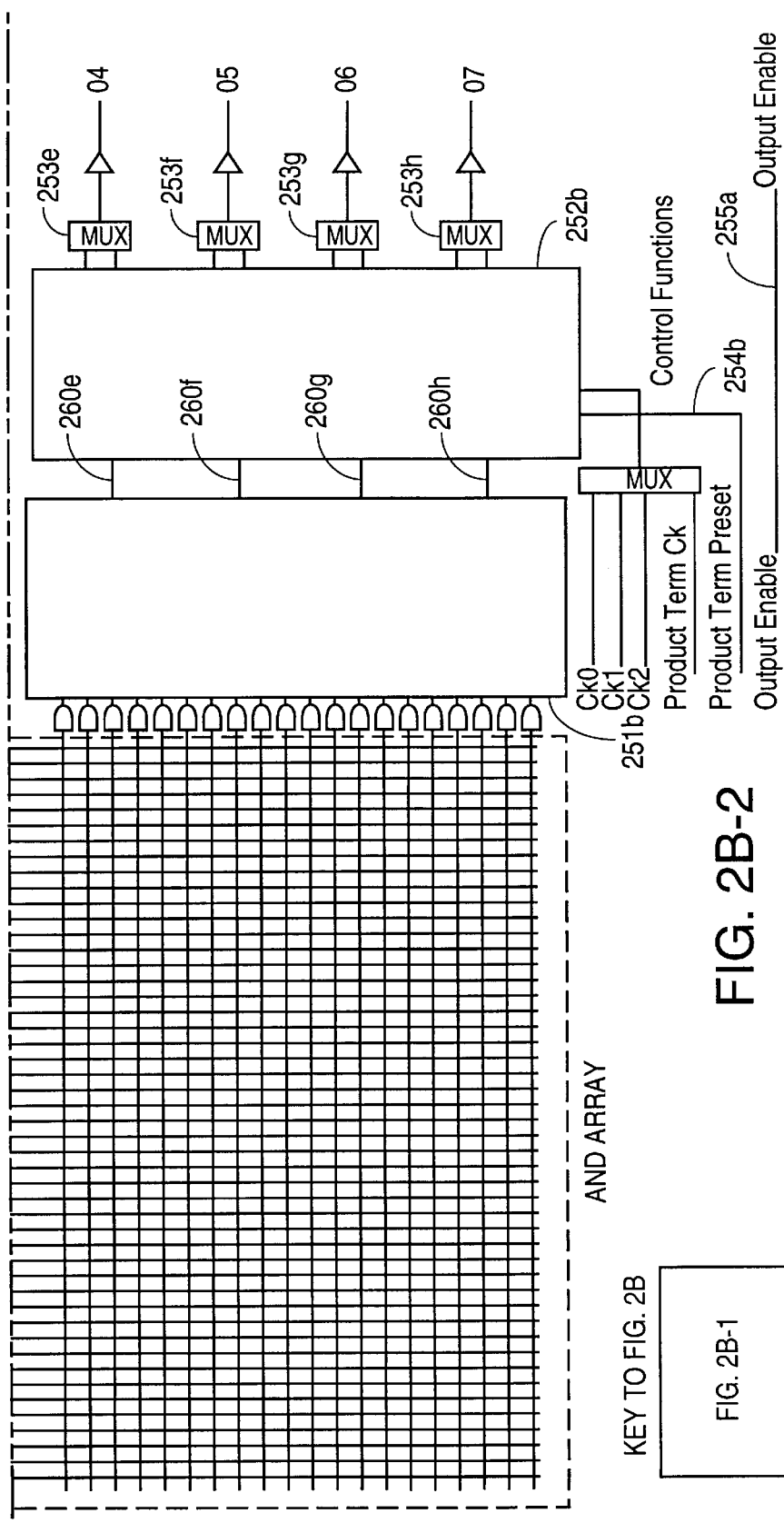

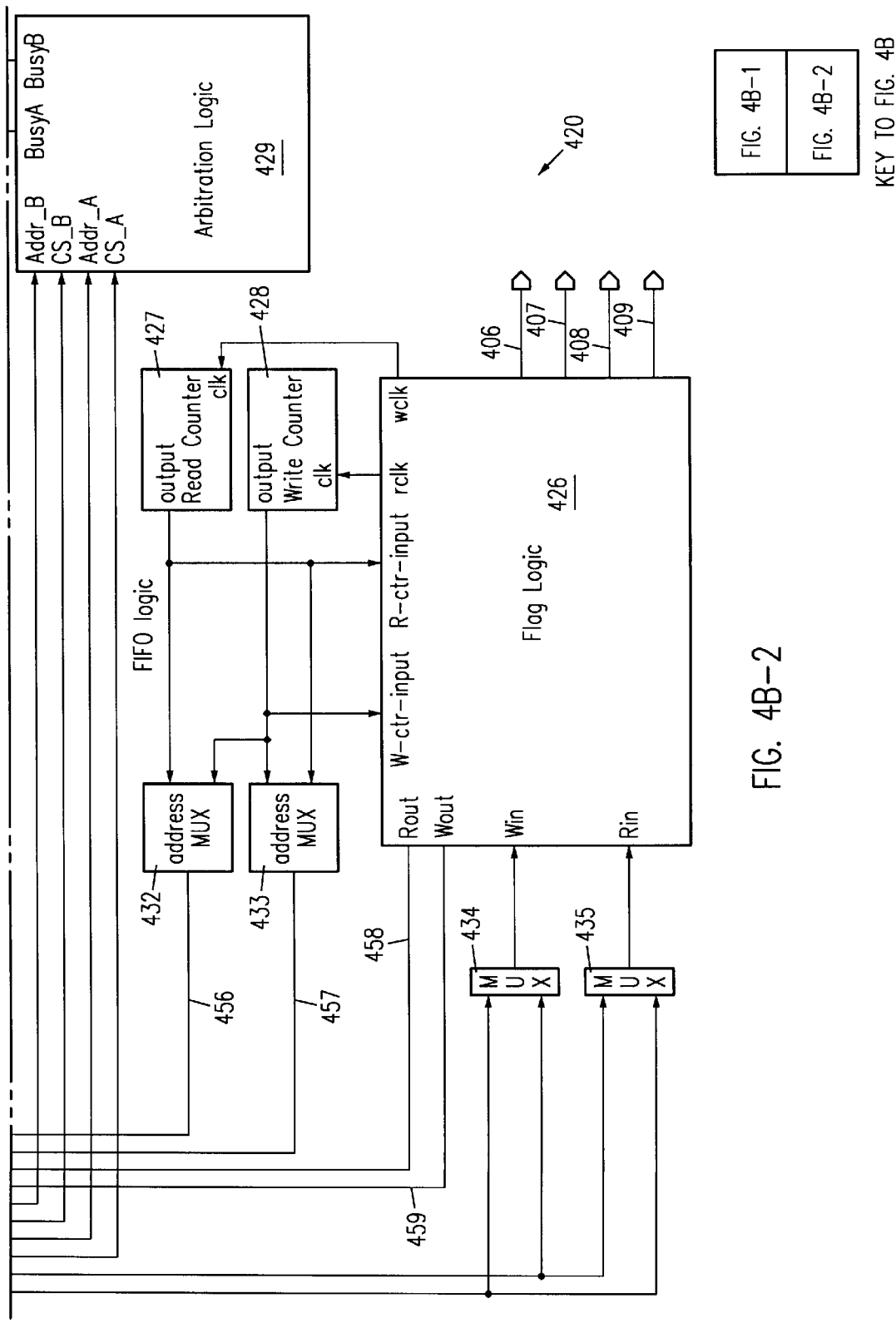

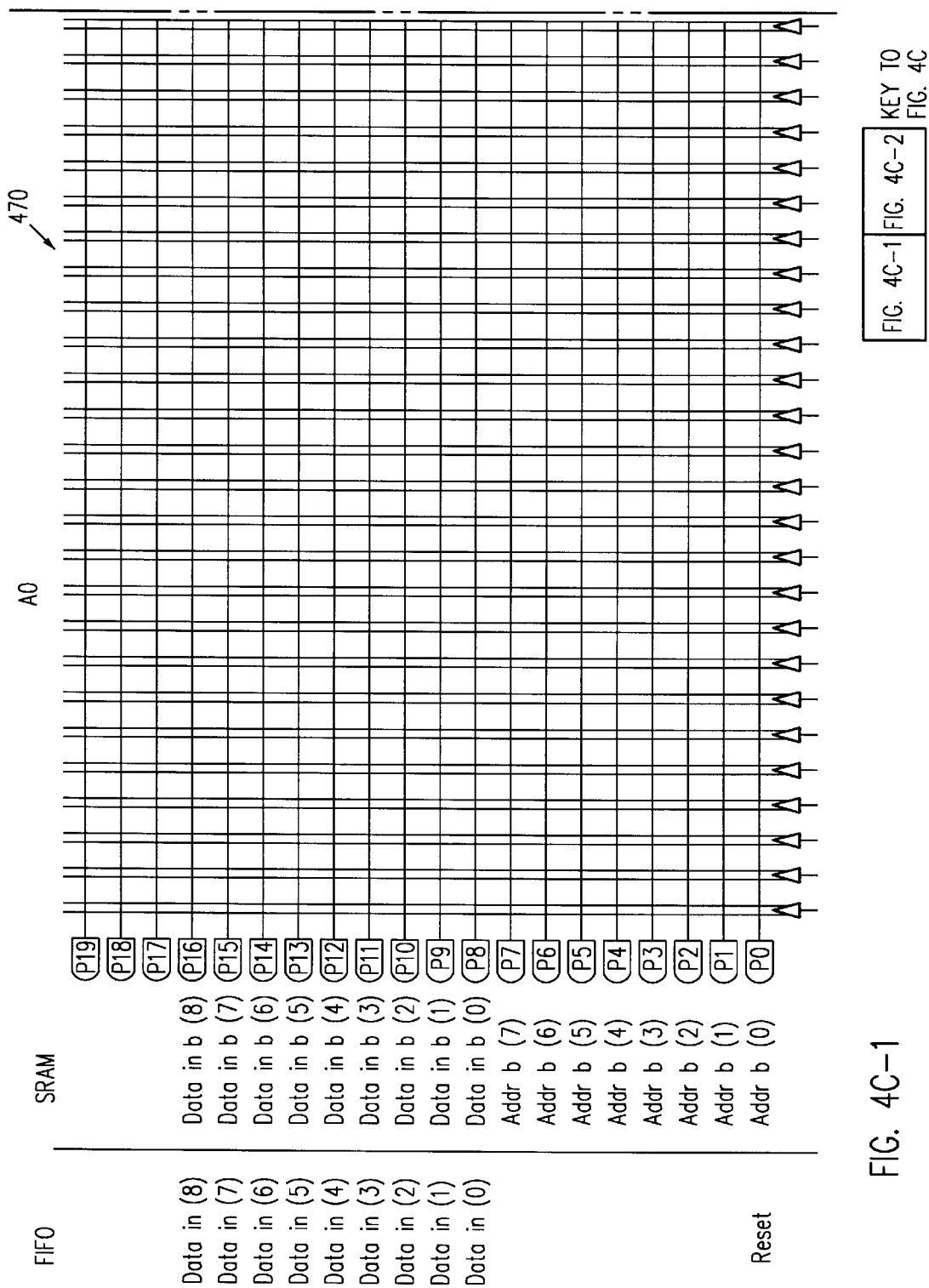

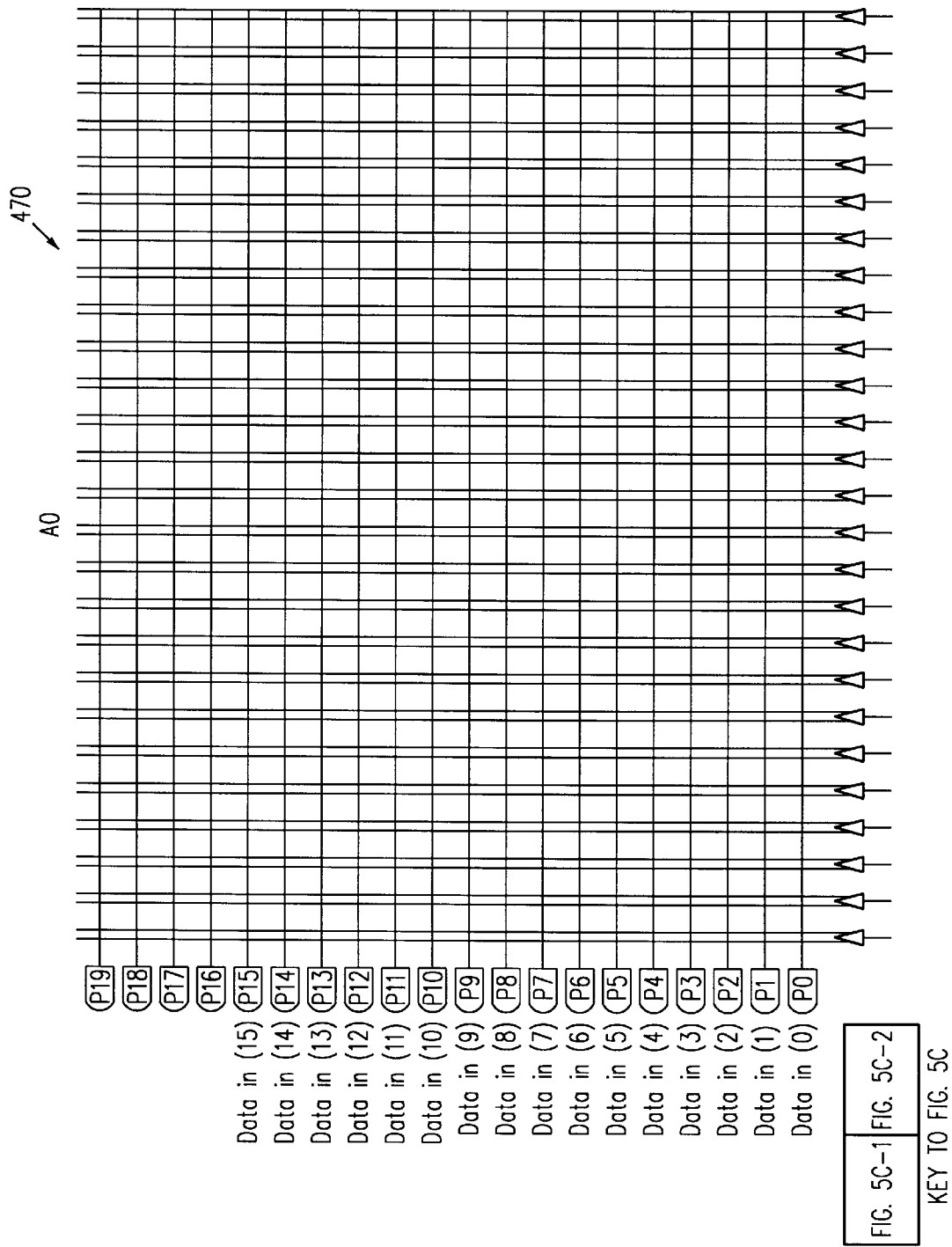

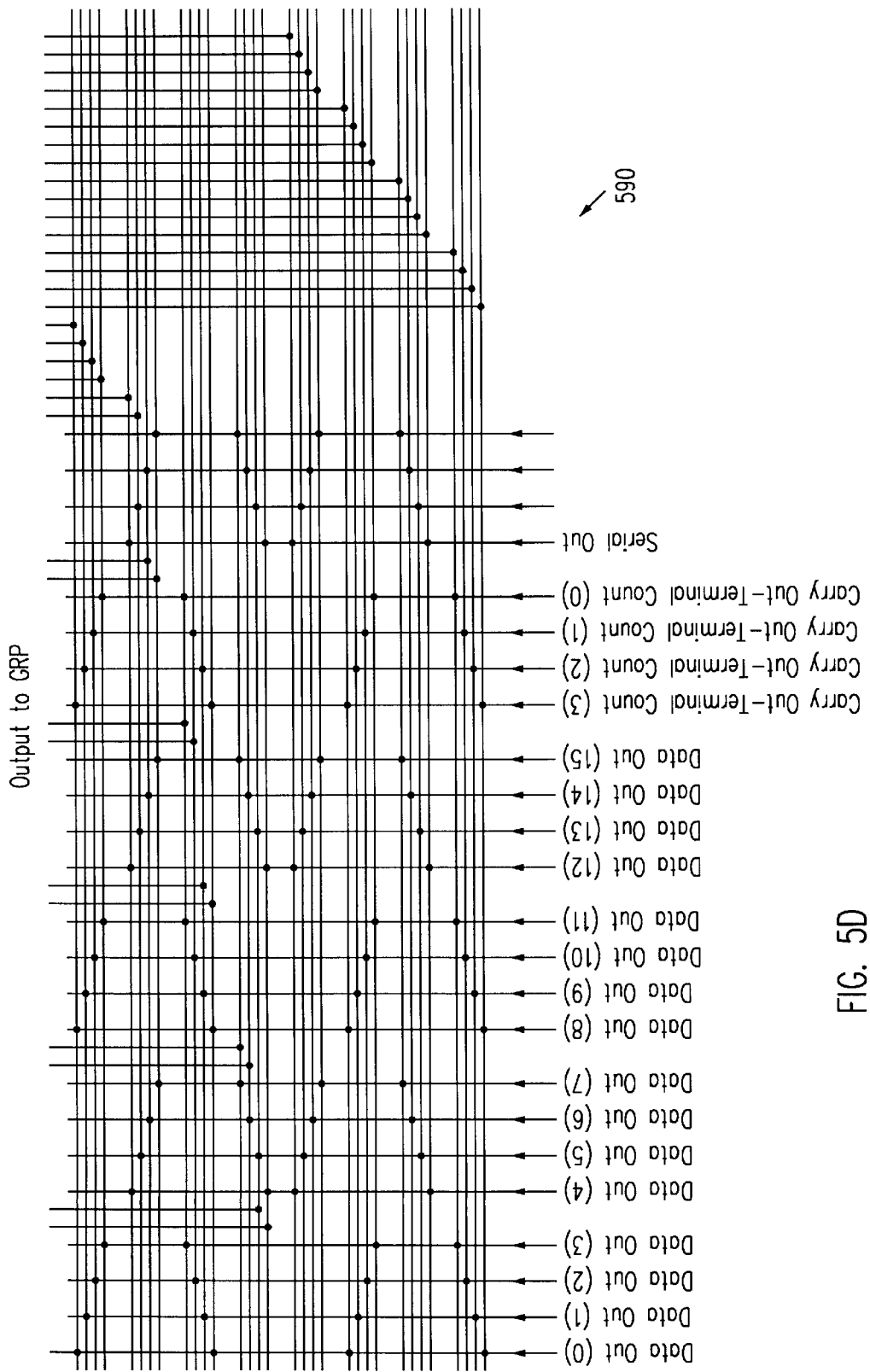

APPLICATION SPECIFIC MODULES IN A PROGRAMMABLE LOGIC DEVICE

This application is a continuation of application Ser. No. 08/482,316, filed Jun. 6, 1995, now abandoned, which application is a continuation of application Ser. No. 08/166,483, filed Dec. 13, 1993, now abandoned.

BACKGROUND OF THE INVENTION

1. Field of the Invention

The present invention relates to the design of programmable logic devices; and, in particular, relates to the design of programmable logic devices which include application-specific modules.

2. Discussion of the Related Art

Two examples of high density programmable logic arrays are the programmable Large Scale Integration (pLSI) devices and the in-system programmable Large Scale Integration (ispLSI) devices from Lattice Semiconductor Corporation, Hillsboro, Ore. An ispLSI device is reprogrammable in its application without being removed from the circuit board. In-system programming techniques are discussed in U.S. Pat. Nos. 4,855,954 (entitled "In-system Programmable Logic Device with Four Dedicated Terminals" to Turner et al, issued Aug. 8, 1989), 4,761,768 (entitled "Programmable Logic Device", to Turner et al, issued Aug. 2, 1988), and 4,896,296 (entitled "Programmable Logic Device Configurable I/O Cell", to Turner et al, issued Jan. 23, 1990). The in-system programming techniques discussed in these U.S. patents are hereby incorporated by reference. Programmable logic devices can also be implemented in both volatile and non-volatile memory technologies (e.g. electrical eraseable programmable read-only memory or $E^2PROM$).

FIG. 1 shows a block diagram of a prior art device 100, which can be implemented as either a pLSI device or an ispLSI device. As shown in FIG. 1, device 100 comprises 24 generic logic blocks (GLBs) A0–A7, B0–B7, C0–C7 and D0–D7. Each GLB includes a number of input terminals, a logic array for implementing logic functions and a number of output terminals. The signals at the GLB's input terminals originate either from the routing pool 101, or directly from input/output (I/O) pins, which are shown in FIG. 1 along the periphery of the device, e.g. I/O pin 102a. The signals of the output terminals of a GLB can be routed to both output routing pool 103 and routing pool 101. Output routing pool 103 routes signals between a group of GLBs and a group of I/O pins. Each I/O pin of pLSI device 100 is associated with an input/output cell ("I/O cell"), which is programmable to define whether the I/O pin is an input pin, an output pin or a bidirectional pin.

Routing pool 101 is an interconnection resource for interconnection among the GLBs. Routing pool 101 receives input signals from both the I/O pins and the output terminals of the GLBs and provides the signals received to the input terminals of the GLBs. Routing pool 101 provides connectivity between any pair of GLBs in pLSI device 100.

In FIG. 1, four groups of GLBs A0–A7, B0–B7, C0–C7 and D0–D7 are shown. Each group of GLBs, together with its output routing pool, the associated I/O cells, and the associated I/O pins, form a structure called a "macroblock". In the prior art, the signal received at each I/O cell is routed to one input terminal of routing pool 101. In addition, two additional input pins are provided per megablock to receive two additional signals into global routing pool.

In the prior art, the GLBs implement all logic functions on the programmable logic device. While the GLBs are extremely flexible, memory elements, such as registers and random access memories, cannot be readily configured in a programmable logic device. Further, many frequently encountered logic circuits, although configurable in the GLBs, can be more efficiently provided in a custom circuit, which provides both efficiency in silicon area and speed.

SUMMARY OF THE INVENTION

In accordance with the present invention, a programmable logic device is provided having a plurality of programmable logic blocks and one or more application-specific blocks. In such a programmable logic device, a programmable logic block typically includes a fixed number of logic gates, and a fixed number of input and output terminals coupled to input/output pins, which are configured by a configuration circuit to implement a logic function. This invention provides an application-specific circuit within the programmable logic device for performing a predetermined logic function. The application-specific circuit can have a fixed number of input and output terminals coupled to the input and output pins of the programmable logic device. In addition, the programmable logic device provides a programmable interconnection resource for programmably interconnecting the programmable logic blocks and the application specific circuit. In-system programming capability can be provided in the programmable logic array. In addition, the present invention can be implemented using either volatile or non-volatile memory technology.

In one embodiment, the programmable interconnection resource comprises a switch matrix of interconnection lines. In that embodiment, a programmable interface interconnection block is provided between the application-specific circuit and the programmable interconnection resource. The programmable interface interconnection block multiplexes each of the input and output terminals of the application-specific circuit onto one or more interconnection lines of the switch matrix. The application-specific circuit further includes a gate array to programmably multiplex input signals received from the switch matrix.

In accordance with one aspect of the present invention, the application-specific circuit includes a configuration circuit to allow the application-specific circuit to be configured into one of numerous configurations. In one embodiment, the application-specific circuit includes a dual-port memory array, which is configurable as to both word size and total array size. In that embodiment, the memory array can be programmably subdivided into one or more memory arrays. A control circuit in that embodiment provides for accessing the memory words of the dual-port memory array in a first-in-first-out manner. The control circuit includes read and write counter for generating addresses for accessing the memory array. A status signal logic circuit indicates qualitatively the amount of valid data in said memory array.

In another embodiment, the application-specific circuit comprises a plurality of registers of programmable sizes. These registers can be independently configured to have parallel or serial input data signals, parallel or serial input data signals, or other variations of these input and output data signals. Alternatively, the application-specific circuit in that embodiment can be configured to implement (i) a shift register of programmable sizes, one or more counters, or one or more timers.

The present invention is better understood upon consideration of the detailed description and the accompanying drawings.

BRIEF DESCRIPTION OF THE DRAWINGS

FIG. 4a is a block diagram of an ASB 400 suitable for implementing ASB 209a of FIG. 2a.

FIG. 4b is a block diagram of memory circuit 420 of FIG. 4a.

FIG. 5a is a block diagram of an ASB 500 suitable for implementing ASB 209b of FIG. 2a.

FIG. 5d shows an interface interconnect block (IIB) 590 routing the output signals of ASB 500 into an LRP.

DETAILED DESCRIPTION OF THE PREFERRED EMBODIMENTS

Figure 1A:
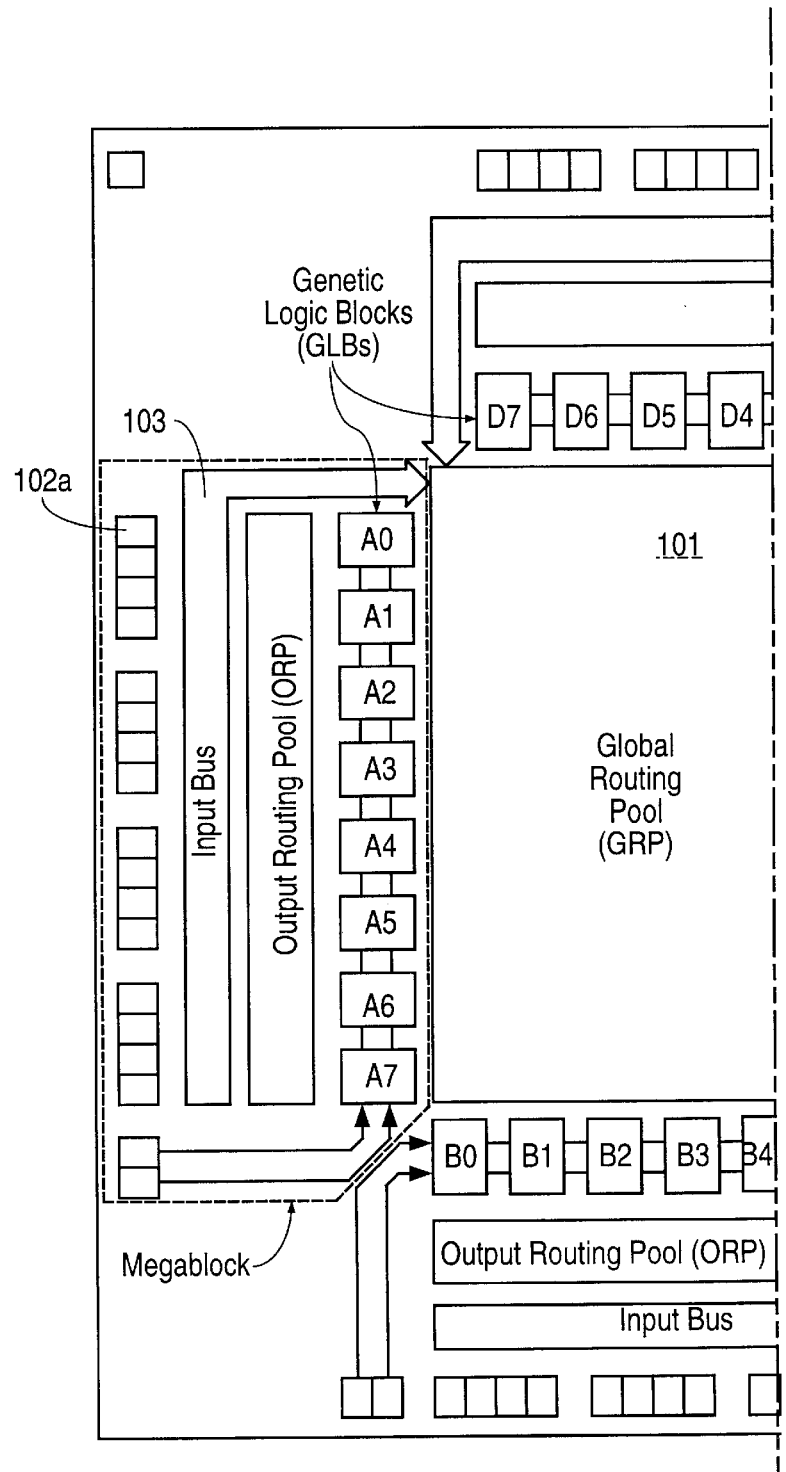
FIG. 1 shows a prior art programmable logic device having a plurality of generic logic blocks (GLBs) for configurating logic circuits.
Figure 1B:
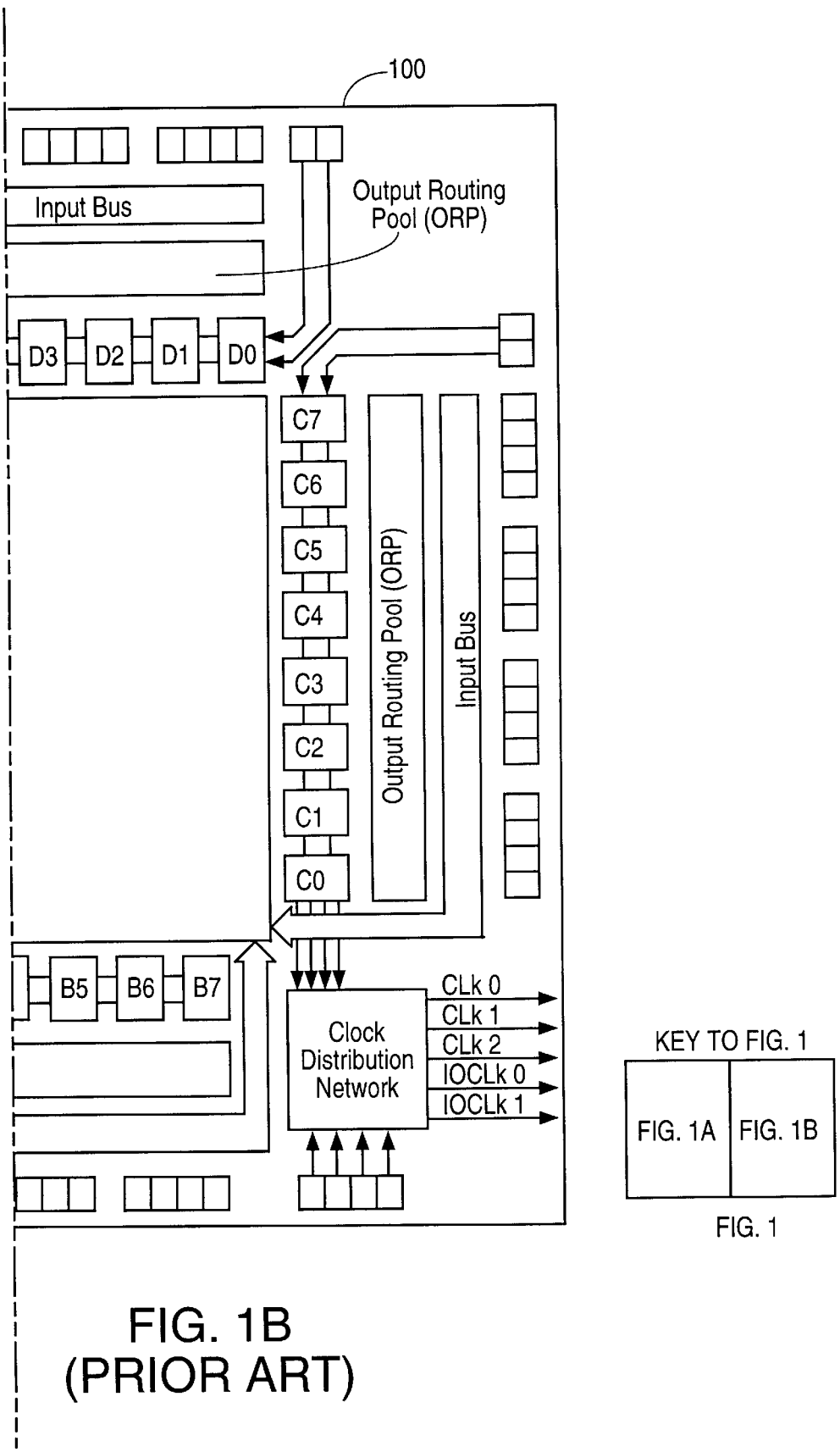
Figures 2, 2A, 3:
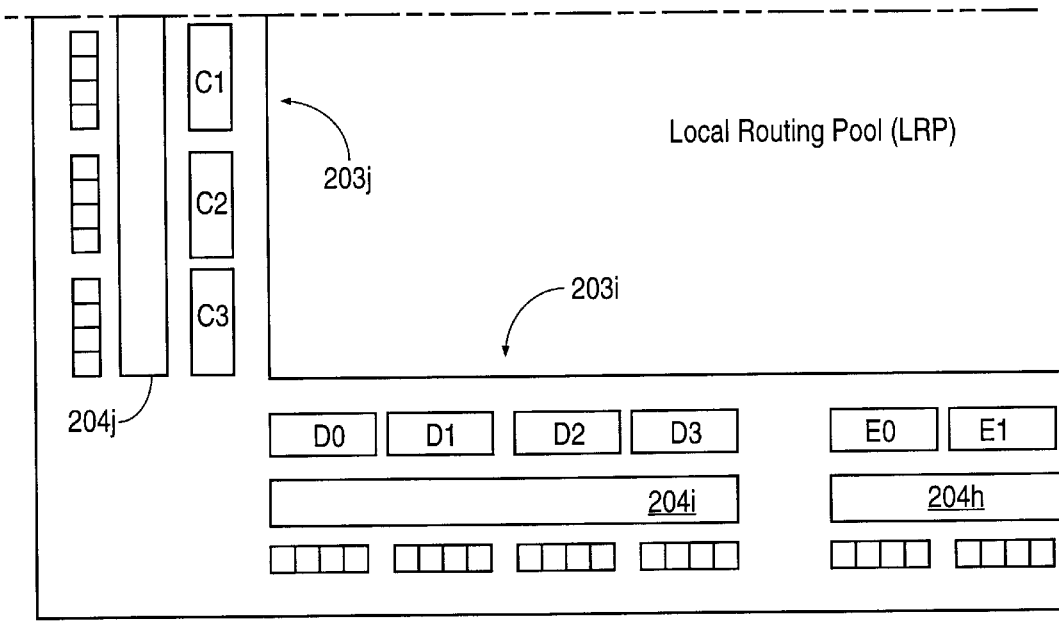
FIGS. 2a–2d show embodiments of the present invention in which a programmable logic device 200 is provided with application-specific modules 209a and 209b, in accordance with the present invention.
FIG. 3 shows global routing pool (GRP) 201 interconnecting local routing pools (LRPs) 202a and 202b.
Figures 2, 2A, 3, 4:
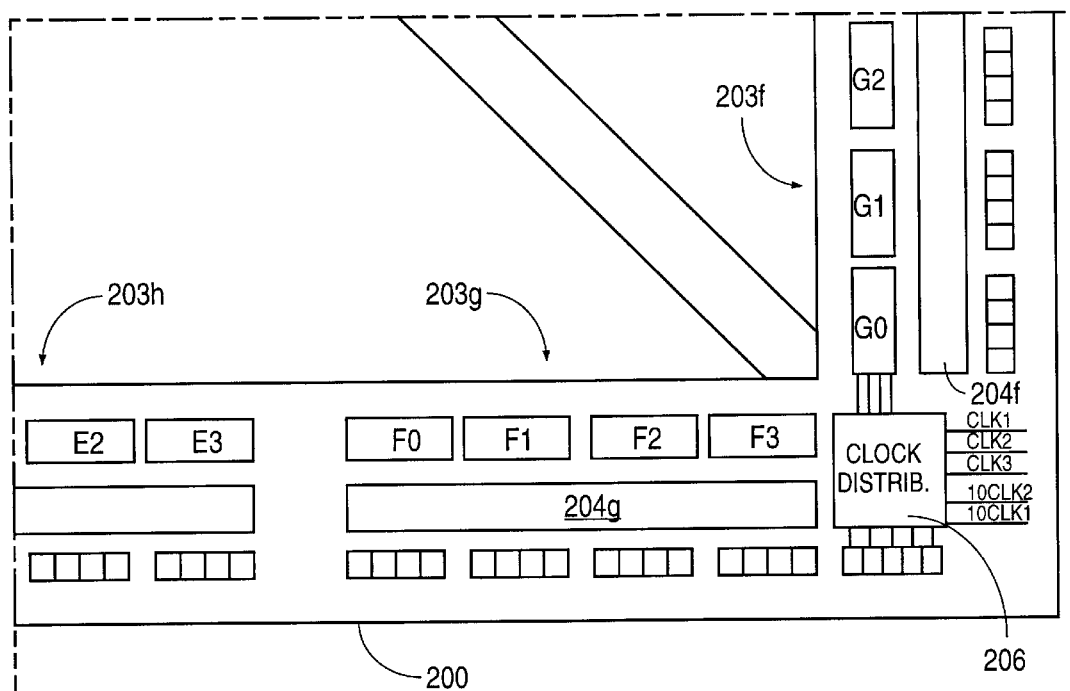

FIG. 2a shows, in one embodiment of the present invention, a block diagram of a programmable logic device 200 including 6 "megablocks" 203a–203l and two application-specific modules ("ASBs") 203a and 203b. Each megablock includes four generic logic blocks ("GLBs"), an output routing pool, and 16 I/O cells. In addiiton, programmable logic device 200 includes a clock distribution structure 206 (not shown), two local routing pools ("LRP") 202a and 202b, and a global routing pool ("GRP") 201. LRP 202a provides connectivity among megablock 203a–203c and the interface interconnect block ("IIB") 208, and LRP 202b provides connectivity among megablocks 203d–203f and IIB 208. GRP 201 provides connectivity between LRPs 202a and 202b. The hierarchical routing scheme, i.e. the use of local and global routing pools, are discussed in detail in U.S. patent application Ser. No. 08/115,723, entitled "Structure and Method for Implementing Hierachical Routing Pools in a Programmable Logic Device," by C. Tsui et al, filed on Sep. 1, 1993, now U.S. Pat. No. 5,394,033 issued on Feb. 28, 1995, assigned to Lattice Semiconductor Corporation, which is also the Assignee of the present invention. The disclosure of application Ser. No. 08/115,723 is hereby incorporated by reference in its entirety.

Clock distribution network 206 receives five external clock signals on five dedicated clock pins. The GLBs can also be configured to generate additional signals as clock input signals to clock distribution network 206. Five clock signals (three clock signals generated in the logic blocks, e.g. GLBs or ASBs, and two clock signals received from the I/O cells) can be distributed from clock distribution network 206 to any GLB, ASB or I/O cell of programmable logic device 200.

Figures 1, 2B:
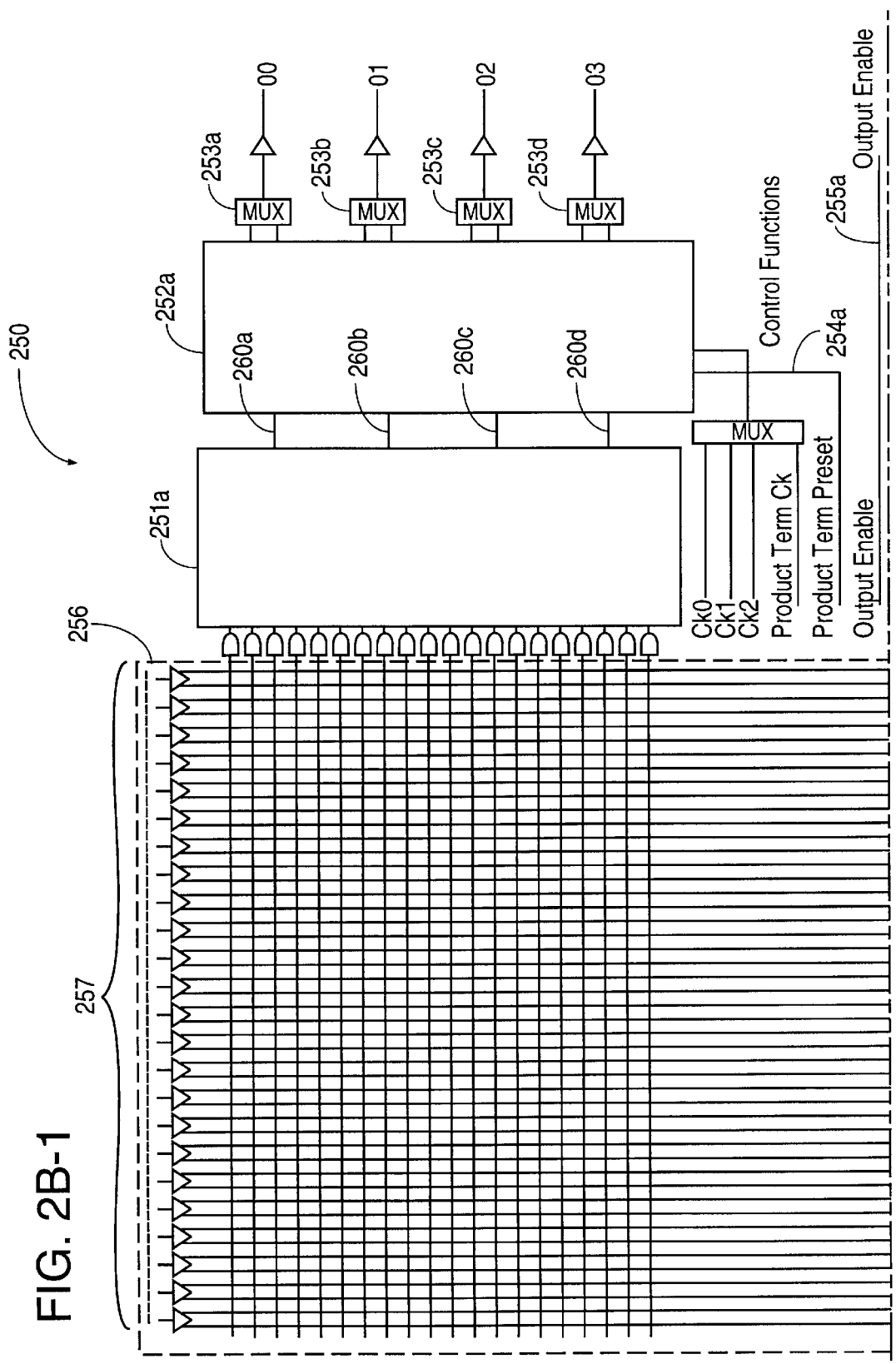

FIG. 2b shows a typical structure 250 of a GLB in programmable logic device 200. As shown in FIG. 2b, each GLB has 24 input terminals (collectively referred to as input terminals 257), eight output terminals O1–O7, and an AND array 256. Input terminals 257 carry signals to AND array 256 from the LRP (say, LRP 202a) which serves GLB 250. AND array 256 receives (a) output signals of GLBs served by LRP 202a, (b) output signals from I/O cells in the megablocks which includes GLBs served by LRP 202a, and (c) output signals received over GRP 201. The signals received over GRP 201 include output signals of GLBs served by LRP 202b, and output signals from I/O cells in the megablocks which includes the GLBs served by LRP 202b. AND array 256 also receives four internal "fast feedback" signals from the product-term sharing arrays ("PTSAs") 251a and 251b of GLB 250.

AND array 256 generates 2 groups of twenty product-term signals. Each product-term signal, which is provided both in logic true and the complement forms, is a logic product involving any number of the input signals received into AND array 256. In FIG. 2b, a first group of twenty product term signals is received by PTSA 251a, and a second group of twenty product term signals is received by PTSA 251b. Product-term sharing arrays, such as product term sharing arrays 251a and 251b, are discussed in detail in U.S. Pat. No. 5,130,574, entitled "Programmable Logic Device Providing Product Term Sharing and Steering to the Outputs of the Programmable Logic Device," to J. Shen et al, filed on May 6, 1991, issued on Jul. 14, 1992, and assigned to Lattice Semiconductor Corporation. U.S. Pat. No. 5,130,574 is hereby incorporated by reference in its entirety.

Output stage 252a includes output logic macrocells providing various programmable logic functional capabilities for generating either a registered or a combinatorial output signals of PTSA 251a. This type of logic macrocells used in output stage 252a are discussed in detail in U.S. Pat. No. 5,191,243, entitled "Output Logic Macrocell with Enhanced Functional Capabilities," to J. Shen et al, filed on May 6, 1991 and issued on Mar. 2, 1993. U.S. Pat. No. 5,191,243 is hereby incorporated by reference in its entirety.

The output signals of multiplexer 253a–253d are provided as output signals O0–O3. Output signals O0–O3 are routed back to LRP 202a or, alternatively, via the output routing pool of GLB 250's megacell to the associated I/O cells.

Figure 2C:
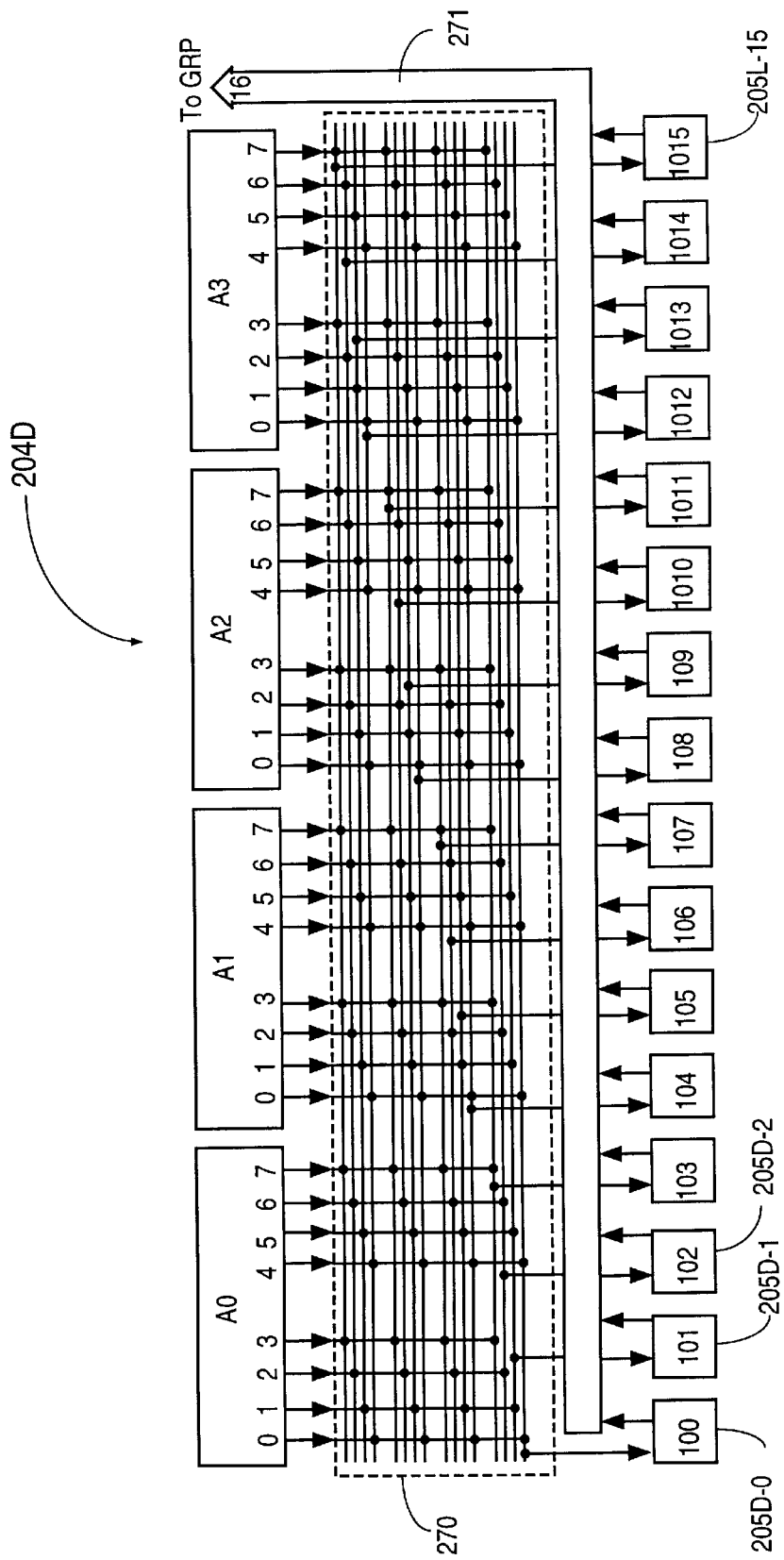

FIG. 2c shows output routing pool 204d, which serves megablock 203d of programmable logic device 200 (FIG. 2a). As shown in FIG. 2c, GLBs A0–A3 of megablock 203d are connected to a switch matrix 270. Switch matrix 270 receives from GLB A0–A3 their 32 output signals, and provides 16 output signals to I/O pins 205d-0 to 205d-15. Each of the 32 output signals of GLB A0–A3 is routed to four I/O cells. These I/O cells can each be independently configured as an input pin, an output pin, or a bidirectional pin. When configured as an input pin, the input signal received is routed via bus 271 to LRP 202b.

Figure 2D:
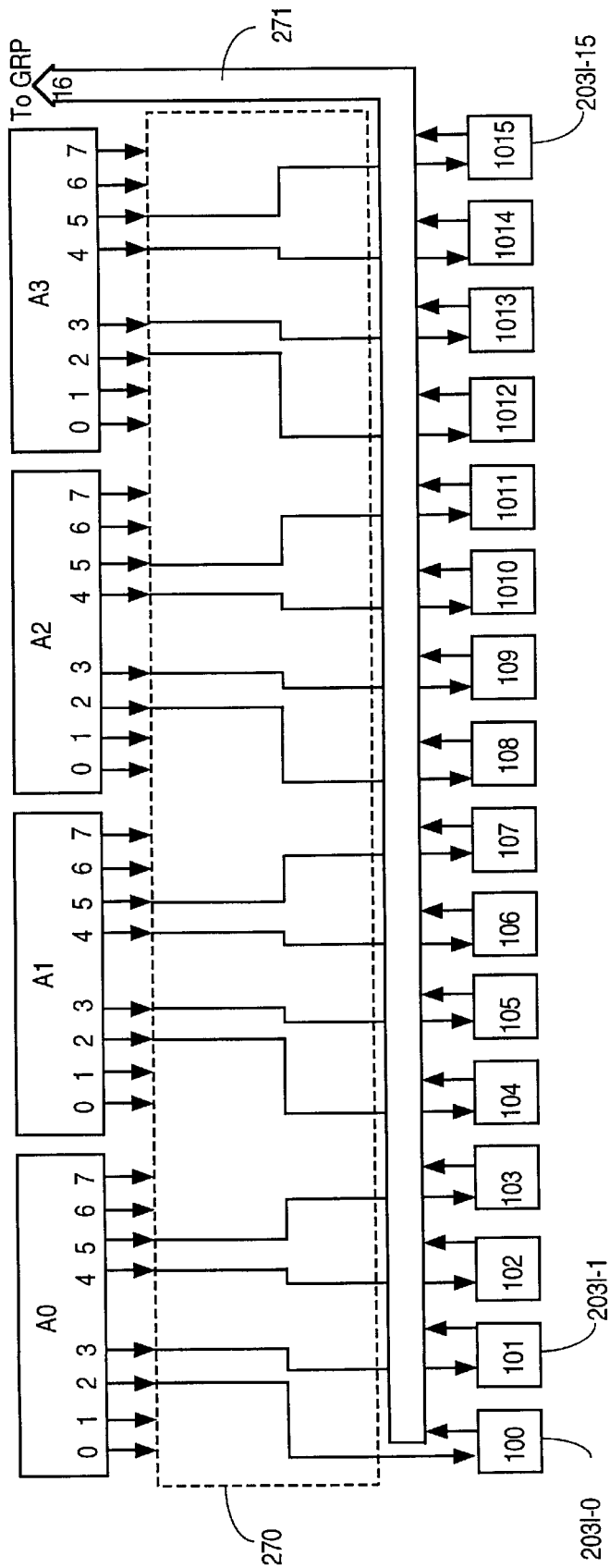
Figure 3:
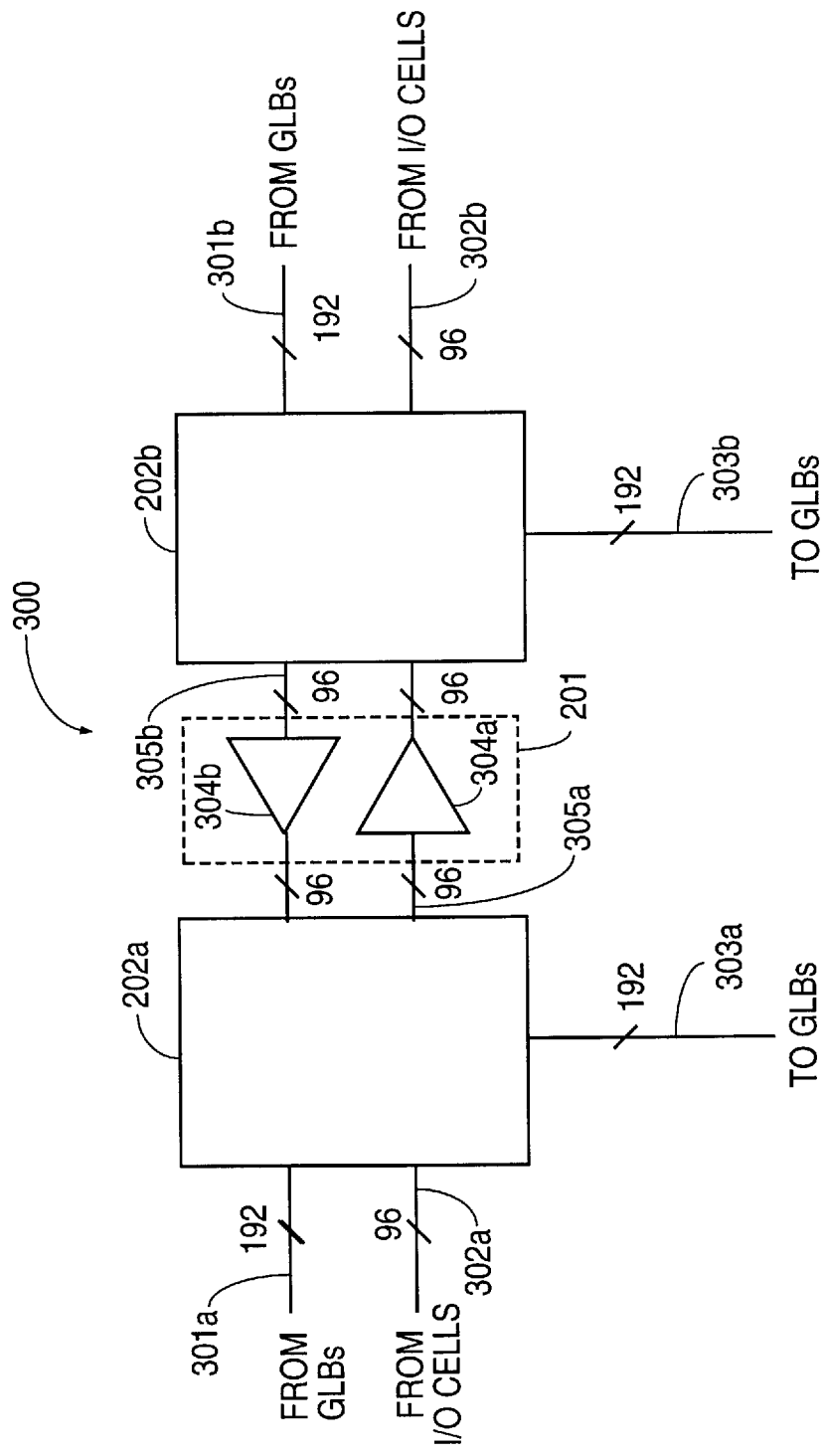

To provide higher speed connections, in each GLB, four output terminals are each provided a programmable bypass signal path to an I/O cell. These bypass connections are shown in FIG. 2d.

LRP 202a and LRP 202b are interconnection resources serving megablocks 203a–203f and IIB 208. IIB 208 is, in turn, a routing resource for routing output signals of ASB 209a and 209b to LRP 202a, as shown in FIG. 2a. Input signals to ASB 209a and 209b can be routed from LRP 202a directly into ASB 209a and 209b. FIG. 3 is a block diagram of a structure 300 implementing LRP 202a, LRP 202b, and GRP 201. As shown in FIG. 3, each LRP has (i) 96 input terminals, collectively indicated by reference numeral 302*a* or 302*b*, receiving input signals from the I/O cells associated with the GLBs served by the LRP, (ii) 192 input terminals, collectively indicated by reference numeral 301*a* or 301*b*, receiving input signals from the eight output signals from the ASBs and the GLBs served by the LRP, (iii) 96 input terminals, collectively indicated by reference numeral 303*a* or 303*b*, for receiving from GRP 201 signals which originate from the other LRP, and (iv) 192 output terminals, collectively indicated by reference numeral 305*a* or 305*b*, for routing each of the 288 input signals received by the LRP to 96 of the input terminals of the ASBs and GLBs served by the LRP. LRP 202*a* and 202*b* are each implemented according to the interconnect structure discussed in U.S. Pat. No. 5,204,556, entitled "Programmable Interconnect Structure for Logic Blocks," by Kapil Shankar, filed May 6, 1991, issued Apr. 26, 1993 and assigned to Lattice Semiconductor Corporation, which is the Assignee of the present application. U.S. Pat. No. 5,204,556 is hereby incorporated by reference in its entirety. LRP 202*a* provides 96 output terminals to route signals through GRP 201 to LRP 202*b*. Likewise, LRP 202*b* provides 96 output terminals to route signals through GRP 201 to LRP 202*a*.

GRP 201 interconnects LRP 202*a* and 202*b*. To improve performance, the interconnections 305*a* and 305*b* are provided buffers, which are collectively indicated by reference numerals 304*a* and 304*b* respectively. Using GRP 201 to interconnect LRP 202*a* and 202*b* maintains connectivity between the GLBs and the ASBs served by LRP 202*b* and the GLBs and the ASBs served by LRP 202*b*, while routing only a fraction of total number of signals received by LRPs 202*a* and 202*b*. Consequently, significant reduction of silicon area is achieved. Structure 300 can be optimally used by preferentially implementing interconnected logic circuits in GLBs served by the same LRP, thereby reducing the number of signals required to be transmitted between LRPs via GRP 201. Under such condition, signals between GLBs, or between a GLB and an ASB, are transmitted over an LRP, which is a smaller interconnection circuit than the alternative under a single routing pool system. Thus, despite the increase in the number of GLBs in the programmable logic device, the signal delays in transmission through the interconnection circuit are kept generally low. Because of the reduced load in the LRP, which serves a smaller number of GLBs, the AC switching currents are generally also kept low. LRP 202*a* and LRP 202*b*, and GRP 201 are each regular in structure, so that signal delays within each LRP, or over GRP 201, remain predictable and consistent.

Figures 1, 4A:
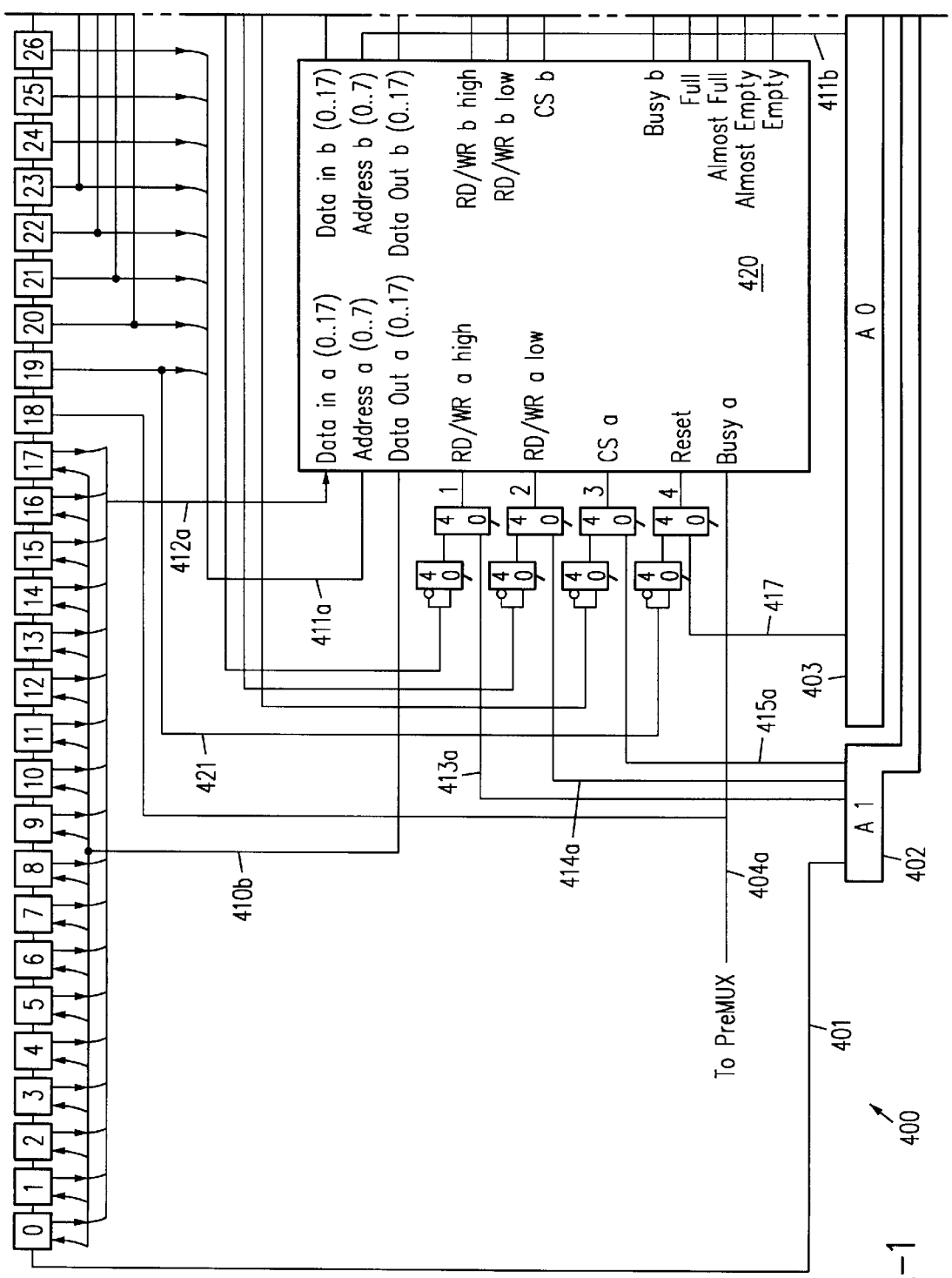
Figures 2, 4A:
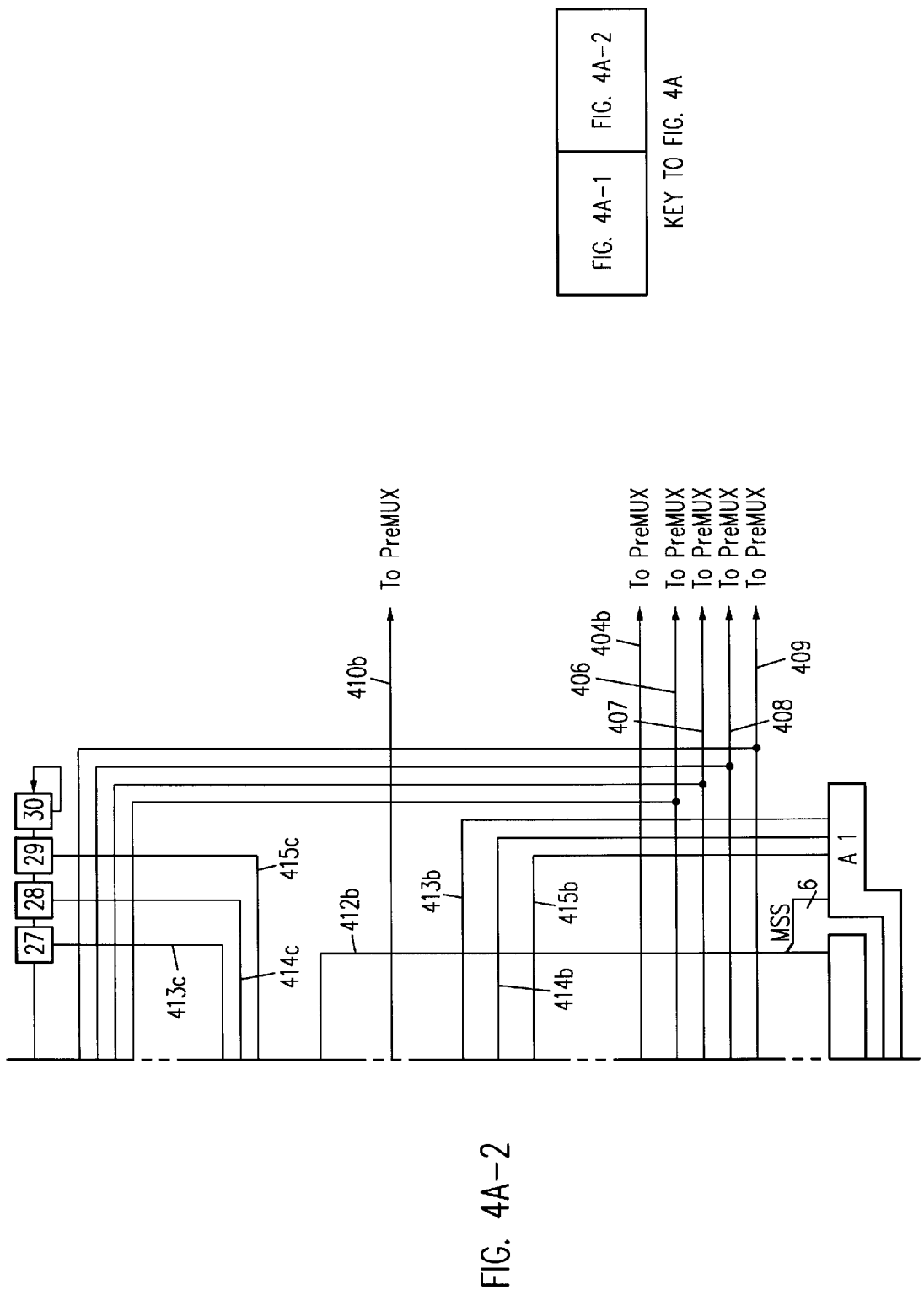

In the present embodiment, ASB 209*a* and 209*b* are respectively a memory module and a register module. In this embodiment, ASB 209*a* can be configured as one of the following: (i) a single-port static random access memory (SRAM), (ii) two single-port SRAMs, (iii) a dual-port SRAM, and (iv) a first-in-first-out (FIFO) memory. FIG. 4*a* is a block diagram of an ASB 400 suitable for implementing memory module ASB 209*a* of FIG. 2*a*. ASB 400 has a memory circuit 420 which can be accessed from two ports "A" and "B". In this embodiment, ASB 400's memory array can be organized either as a 512×9 or a 256×18 memory array.

Ports A and B of ASB 400 each comprise 18 data I/O signals, 8 address signals, a busy signal, a chip select signal, and and two read/write control signals. The address signals are primarily used when ASB 400 is configured as SRAMs. When configured as a FIFO memory, four status signals "full", "almost full", "empty", and "almost empty" are generated by ASB 400. A reset signal is also received by ASB 400 when it is configured as a FIFO memory.

Port A is accessible from the I/O pins of the programmable device. As shown in FIG. 4*a*, I/O cells 0–17 form an 18-bit data bus accessible through 18 corresponding pins of the programmable logic device. An output enable signal, which is either generated in a GLB or received as a global output enable signal, is provided to I/O cell 0 from one of two groups A0 and A1 of interconnection lines receiving signals from an LRP (A0 and A1 are output lines of two AND arrays 470 and 471, described below, used for routing the signals lines of the LRP into ASB 400). Output enable signals for programmable logic device 200 are discussed in a application Ser. No. 08/115,475, entitled "Output Enable Structure and Method for a Programmable Logic Device," by Ju Shen et al, filed on Sep. 1, 1993, and assigned to Lattice Semiconductor Corporation. This copending application is hereby incorporated by reference in its entirety. The output enable signal used selected for I/O cell 0 is provided by I/O cell 0 to each of the I/O cells 1–17.

In port A of ASB 400, bus 412*a* carries the input signals received at I/O cells 0–17 to memory circuit 420 as data input signals. Data output signals provided by memory circuit 420 are routed to I/O cells 0–17 by bus 410*a*. ASB 400 can also be configured to have either a 9-bit data path or a 18-bit data path. When a 9-bit data path is desired, I/O cells 9–17 can be used for other input/output purposes. A busy signal generated by ASB 400 indicates a "busy" port A, when the memory cell sought to be accessed through port A is simultaneously accessed by a pending memory access at port B. This busy signal is routed to I/O cell 18 via lead 404*a*. When ASB 400 is configured for use as an SRAM, I/O cells 19–26 form a 8-bit bus for receiving a memory address, which is routed to memory circuit 420 via bus 411*a*. When ASB 400 is configured for use as a FIFO memory, I/O cell 19 receives a reset signal which is routed to memory circuit 420 on lead 421, and I/O cells 20–23 receive the four status signals "full", "almost full", "empty" and "almost empty" from memory circuit 420 via leads 406–409 respectively. Memory circuit 420 can also receive an internally generated reset signal, which is routed from the associated LRP into ASB 400 through group A0 of interconnect lines. ASB 400 can be programmed to select either the reset signal on lead 421 or the reset signal on lead 417 routed via the LRP. When configured as an SRAM, ASB 400 receives read/write control signals and a chip select signal respectively from either (i) I/O cells 27–29, over leads 413*c*, 414*c*, and 415*c*, or (ii) the LRP, via leads 413*a*, 414*a*, and 415*a*.

The output signals of memory circuit 420, e.g. data output signals of Port B, are routed to an IIB 490, which provides an interface into an LRP. These output signals of memory circuit 420 are the data output signals of port B (bus 410), busy signals for ports A and B (leads 404*a* and 404*b*, respectively), "full" signal (lead 406), "almost full" signal (lead 407), "almost empty" signal (lead 408), and "empty" signal (lead 409).

The I/O signals of port B of memory circuit 420 are similar to the I/O signals of port A. However, since the signals at port B are routed through the LRP, the signals at port B can be coupled to the GLBs of programmable logic device 200. Memory circuit 420 can therefore be used to support the logic functions implemented in the GLBs. Thus, memory circuit 420 provides an effective on-chip memory for many applications.

Figures 1, 4B:
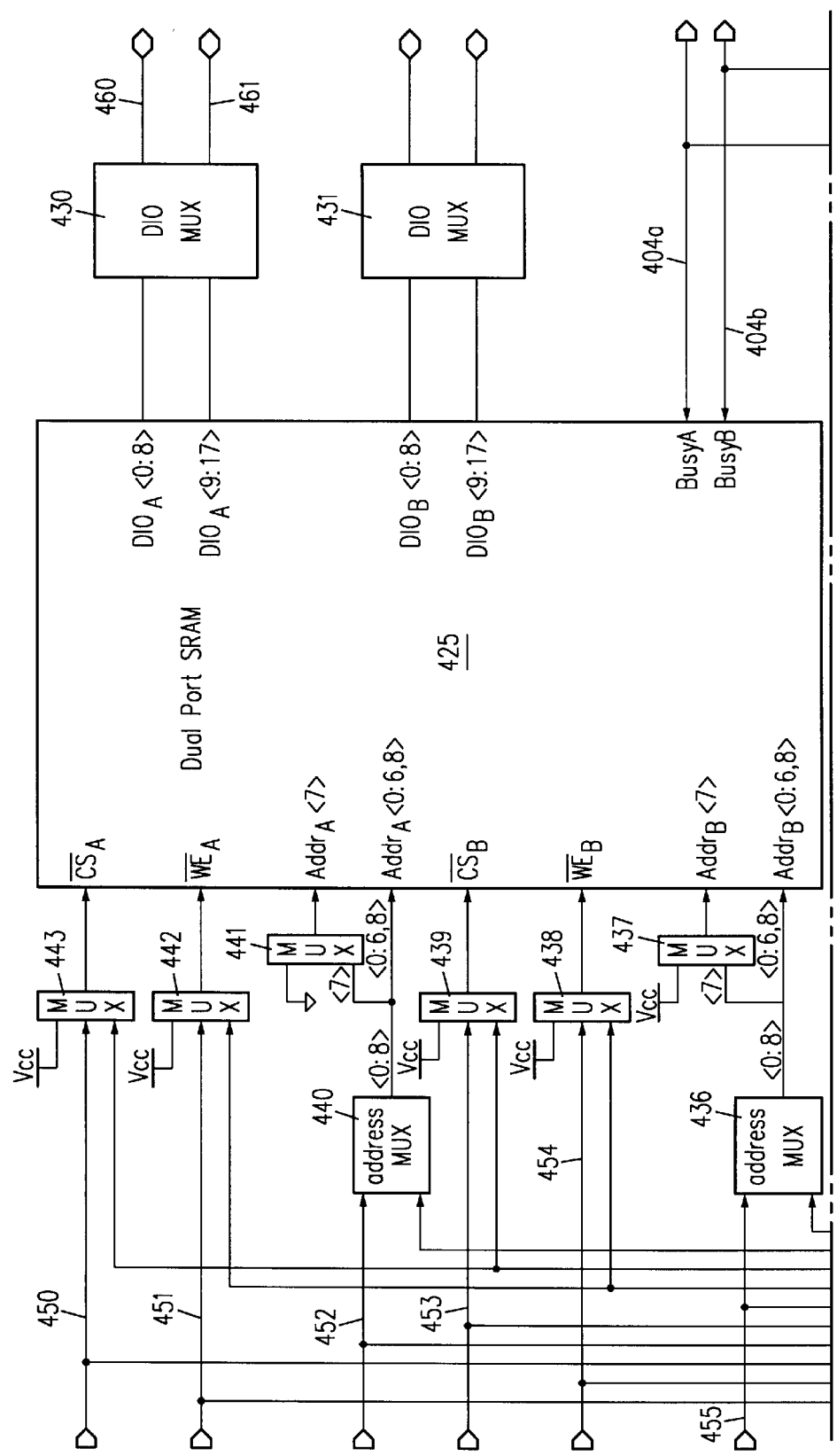

FIG. 4*b* shows an implementation of memory circuit 420 of FIG. 4*a*. As shown in FIG. 4*b*, memory circuit 420 comprises a dual-port SRAM 425, which is accessed either from port A or port B. When ASB 400 is configured as an SRAM, multiplexers 440, 442, and 443 are programmed to select (i) the port A address signals of bus 452, (ii) the read/write control signal on lead 451, and a chip select signal on lead 450. The address signals on bus 452 are the signals shown in FIG. 4a on bus 411a. The read/write control signal on bus 451 can be one of the read/write control signals of leads 413a, 413c, 414a or 414c of FIG. 4a. The read/write control signals of FIG. 4a also selects whether ASB 400 has a 9-bit data path or an 18-bit data path at the I/O pins. Selection of data path width is accomplished by multiplexer 430, which routes the data input/output signals of dual-port SRAM 425 to the 18-bit data path (busses 460 and 461), or the 9-bit data path (either bus 460 or 461, as detemined by the programming of programmable logic device 200). The chip select signal on lead 450 can be the signal on either lead 415c or 415a of FIG. 4a. The port B signals under an SRAM configuration of ASB 400 are provided in a manner similar to that described above with respect to port A signals.

When ASB 400 is configured as a dual-port SRAM, a busy signal for one port is generated whenever a later arriving memory access at that port attempts to access the same memory address as the memory address being then accessed at the other port. The busy signal is generated by arbitration logic circuit 429, which compares addresses at port A and port B whenever the chip select signals at both ports A and B are asserted. The busy signal at port A is asserted when the chip select signal at port A is later than the chip select signal at port B, and vice versa.

When ASB 400 is configured as two single-port SRAMs, each SRAM is either 128×18-bit or 256×9-bit. To divide the address space of dual-port SRAM 425 into the two single-port SRAMs each independently accessed through one of ports A and B, multiplexers 441 and 437 fixes bit 7 of the addresses presented at ports A and B to opposite values.

When ASB 400 is configured as a FIFO memory, one of ports A and B is selected to be the "read" port (i.e. output port) of the FIFO memory, and the other port is selected to be the write port (i.e. input port) of the FIFO memory. Read counter 427 generates the read address of the FIFO memory. This read address is routed by multiplexers 432 or 433 to either multiplexer 436 (port B) or multiplexer 440 (port A). Likewise, write counter 428 generates the write address of the FIFO memory. The write address of the FIFO memory is routed by multiplexers 432 or 433 to either multiplexer 436 (port B) or multiplexer 440 (port A). Under the FIFO configuration, to control read and write counters 427 and 428, the write enable signals of ports A and B are routed to flag logic circuit 426 on leads 451 and 454 respectively. Flag control logic circuit 426 detects the "full", "empty", "almost empty" and "almost full" conditions. The "almost full" and "almost empty" conditions are each generated when the number of valid data stored in the FIFO memory reaches the programmable threshold for the respective condition.

Figures 2, 4C:
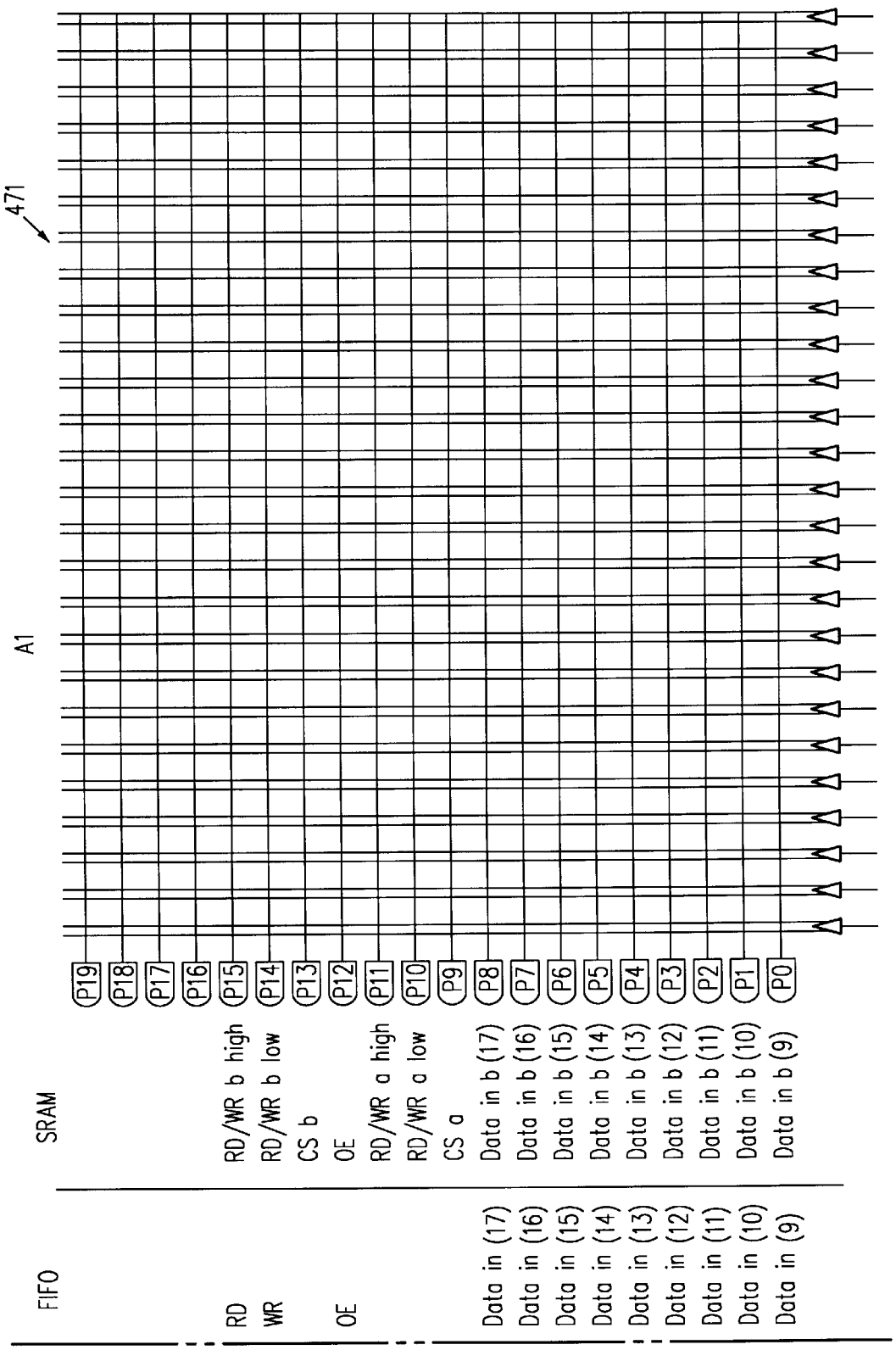
FIG. 4c shows AND arrays 470 and 471 providing the two groups A0 and A1 of interconnect lines routing signals from an LRP to ASB 400 under either an SRAM configuration or a FIFO memory configuration of ASB 400.

FIG. 4c shows AND arrays 470 and 471 providing the two groups A0 and A1 of interconnect lines routing signals from an LRP to ASB 400 under both an SRAM configuration and a FIFO memory configuration of ASB 400. The assignments of the interconnect lines in the groups A0 and A1 under each configuration are shown in the respective columns on the left of each AND array.

Figure 4D:
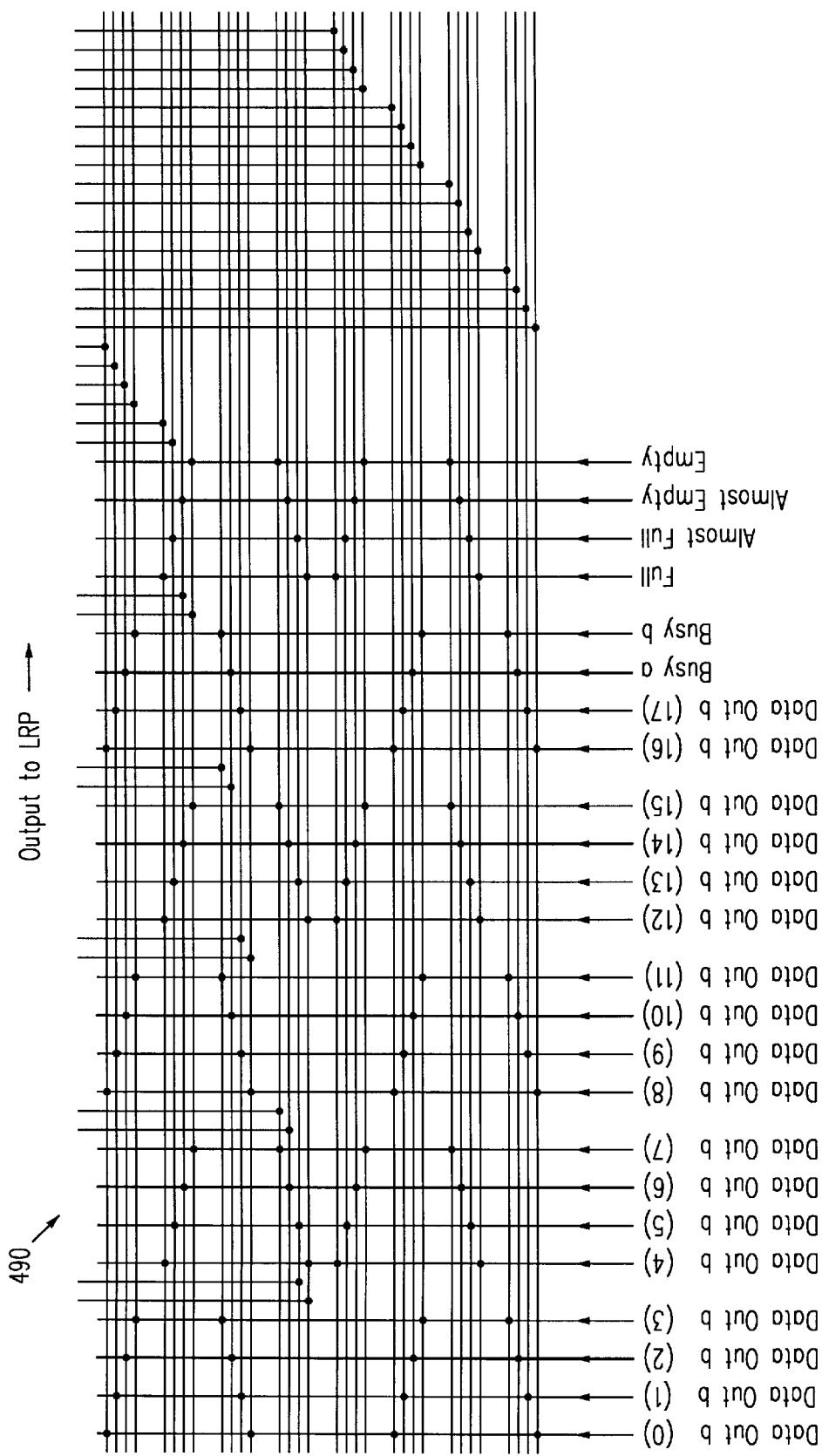
FIG. 4d shows an interface interconnection block (IIB) 490 routing the output signals of ASB 400 into an LRP.

FIG. 4d shows an interface interconnect block (IIB) 490 routing the output signals of ASB 400 into an LRP. As shown in FIG. 4d, each input signal to IIB 490 can be routed to one of four LRP lines.

Figure 5A:
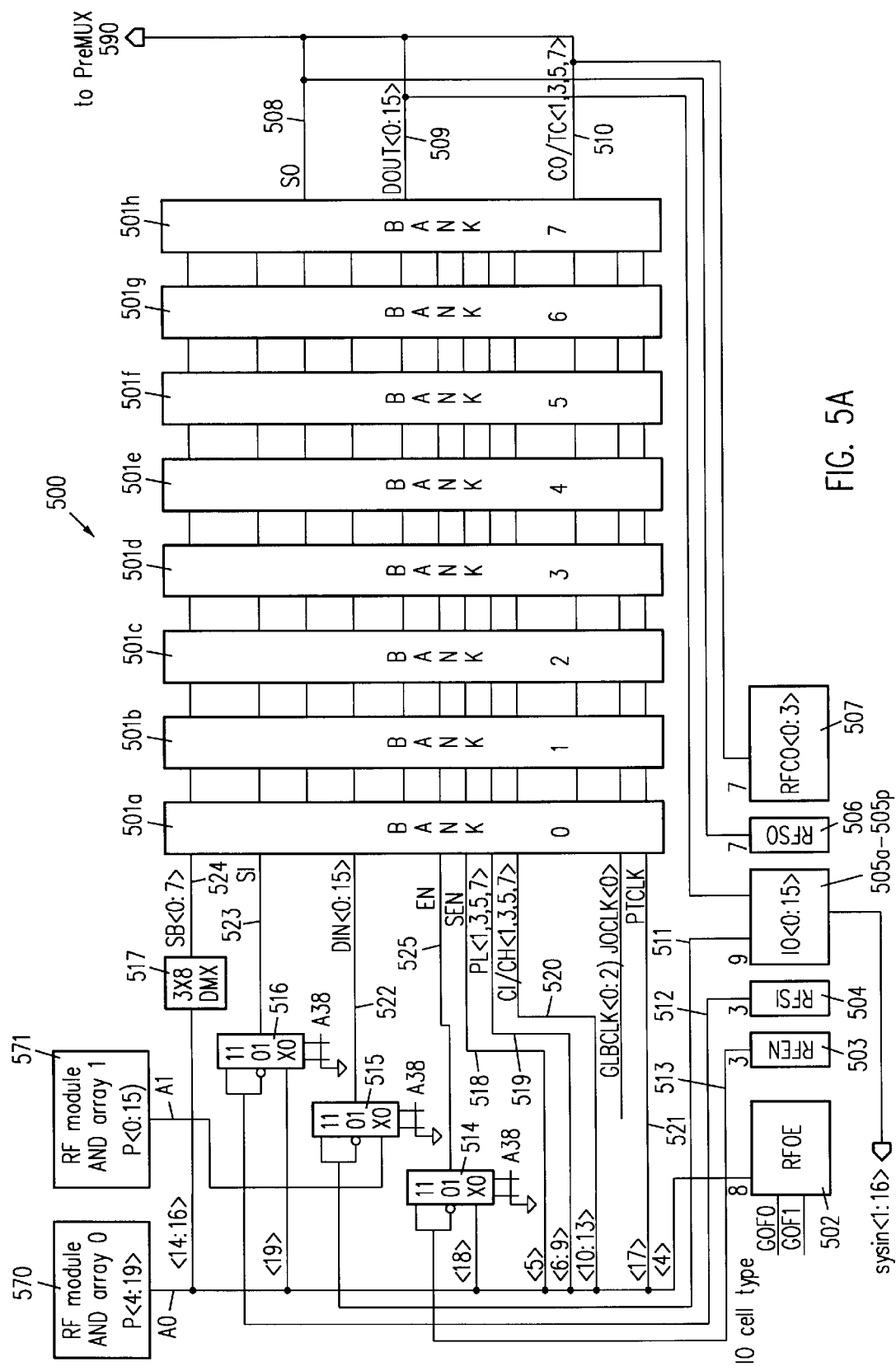

FIG. 5a is a block diagram of ASB 500 which can be used to implement ASB 209b of FIG. 2a. ASB 500 can be configured as (i) a register file of up to eight registers; (ii) a counter bank of up to four counters; (iii) a timer bank of up to four modulo counters ("timers"); and (iv) a shift register. ASB 500 can be configured to form a shift register of one of many lengths. When configured as a shift register, ASB 500 can be a serial input and serial output shift register, a serial input and parallel output shift register, or a parallel input and serial output shift register.

As shown in FIG. 5a, ASB 500 comprises eight banks 501a–501f of registers, which can each be configured to be 4, 8, 12 or 16 bits wide. ASB 500 receives input signals on two groups A0 and A1 of interconnection lines from two AND arrays 570 and 571, and from I/O pins of programmable logic device 200. ASB 500 provides output signals to both an associated LRP, via an interface interconnection block (IIB) 590, and I/O pins of programmable logic device 200.

As shown in FIG. 5a, block 502 contains a logic circuit for selecting an output enable signal to be used in the I/O cells of ASB 500. The I/O cells of ASB 500 associate selected input and output signals of ASB 500 with the I/O pins of programmable logic device 200. In this embodiment, to control the I/O cells of ASB 500 configured for output, block 502 can be configured to select an output enable signal from two global output enable signals and a product term output enable signal.

As shown in FIG. 5a, I/O cell 503 receives an enable signal from an I/O pin. This enable signal, which is provided on lead 513 and routed to register banks 501a–501h by configuring multiplexer 514, parallel loads a selected register the data received on the I/O pins associated with I/O cells 505a–505p. When ASB 500 is configured for serial input under a shift register mode, I/O cell 504 receives a serial input signal at an associated I/O pin. This serial input signal, which is provided on lead 512, is routed to register banks 501a–501h by configuring multiplexer 516. I/O cells 505a–505p can be used to configured the associated I/O pins as input pins, output pins or bidirectional pins for parallel data input and/or output for ASB 500. Input signals received at the I/O pins associated with I/O cells 505a–505p are provided on internal data bus 511. Likewise, output signals provided on the I/O pins associated with I/O cells 505a–505p are received from internal data bus 509. When ASB 500 is configured to provide serial output, I/O cell 506 provides a serial output signal at an associated I/O cell. When ASB 500 is configured for as a counter or timer bank, I/O cell 507 provides up to four "count carry out" or "terminal count" signals. Under counter mode, the "count carry out" signals can be used to cascade ASBs of multiple programmable logic devices to form larger counters. Under timer mode, when a timer reaches a predetermined count value, a terminal count signal is asserted. The output signals of register banks 501a–501h (specifically, serial output signal 508, parallel data output bus 509 and count carry out signals 510) are also provided to IIB or "premux" 590 for routing to an associated LRP.

When configured for parallel input or parallel output, one of register banks 501a–501h is selected by demultiplexer 517, according to the value of a 3-bit signal received on the A0 group of interconnection lines. The A0 group of interconnection lines also provides a serial input signal and a parallel load enable signal, which can be selected, by suitably configuring multiplexers 516 and 514, in place of the serial input signal on lead 513 and the parallel load enable signal 512 received from the I/O pins. In addition, group A0 provides: (a) a "shift enable" signal on lead 518 for serial input or output, (b) under counter or timer mode, four "pre-load" signals on bus 519 for parallel loading of counters, (c) four "carry in" or "count hold" signals on bus 520 (in counter mode, "carry in" signals; in timer mode, "count hold" control signals); and (d) a product term clock signal on lead 521. Under counter mode, each asserted "carry in" signal causes an associated counter to increment or decrement in the next clock period. Under timer mode, each "count hold" signal prevents the associated timer from incrementing or decrementing the count in the timer during the next clock period.

The embodiment of FIG. 5a can be configured to use one of the 5 clock signals: any one of three global clock signals, a clock signal received from an I/O cell, or a product term clock signal generated by internal logic.

Figures 1, 5B:
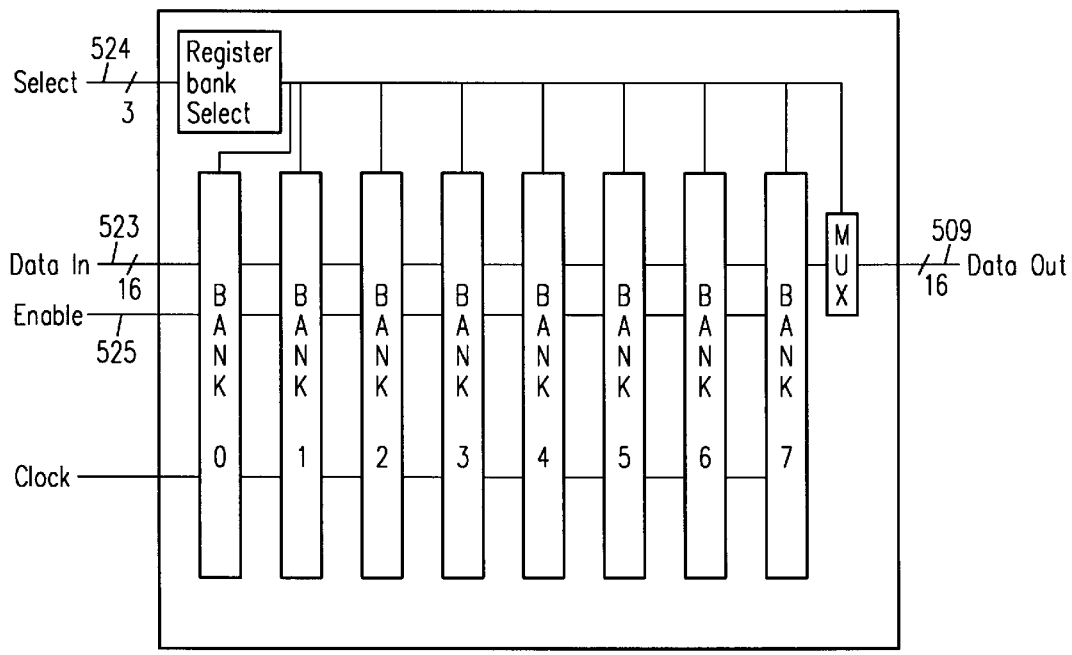
FIGS. 5b(i)–5b(vi) show the various possible configurations of ASB 500.
Figures 2, 5B:
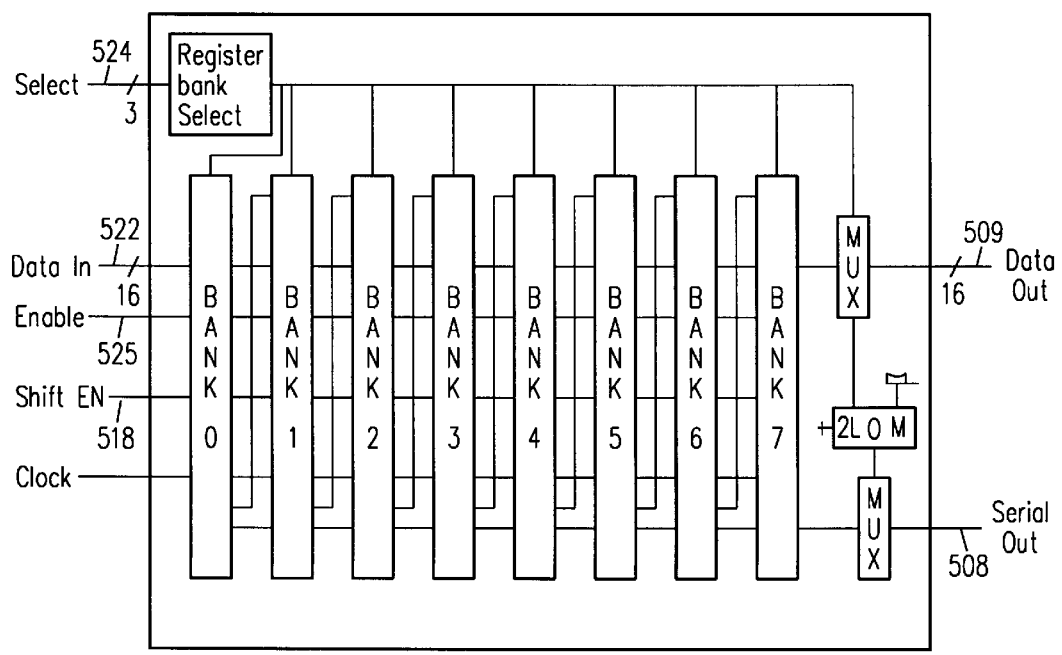
Figures 3, 5B:
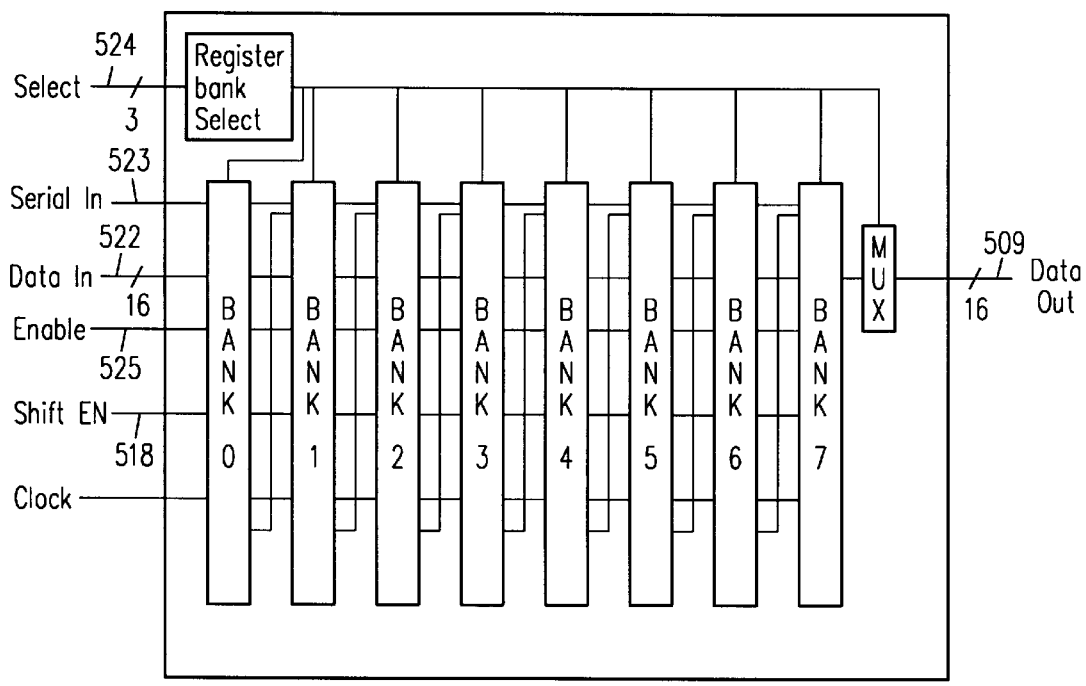
Figures 4, 5B:
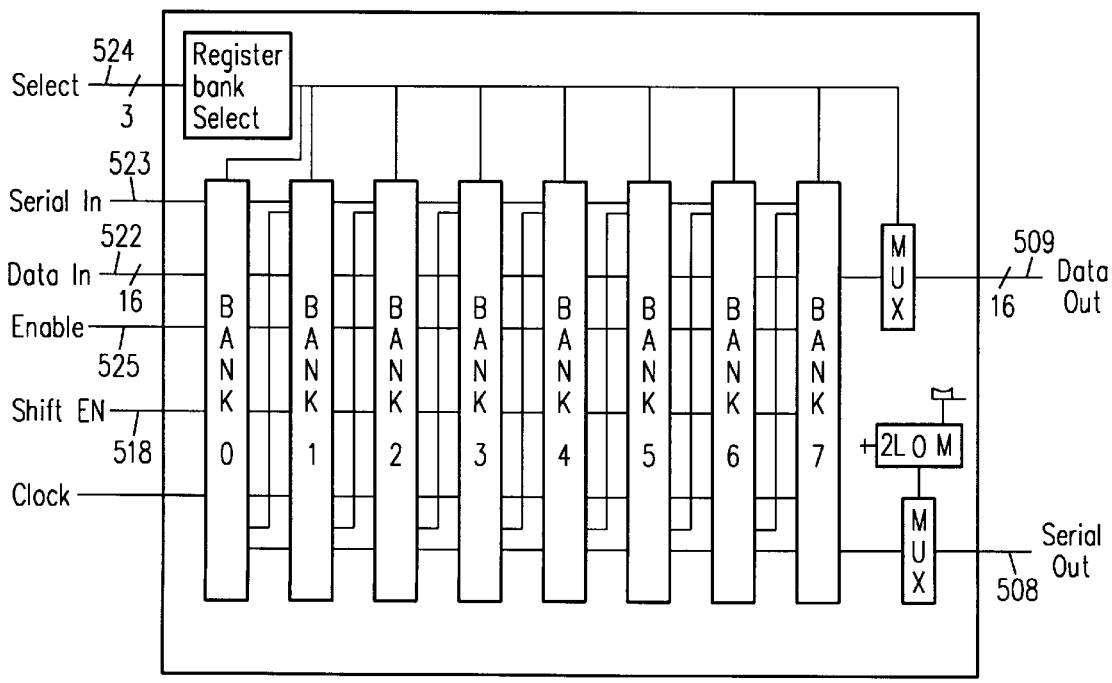
Figures 5, 5B:
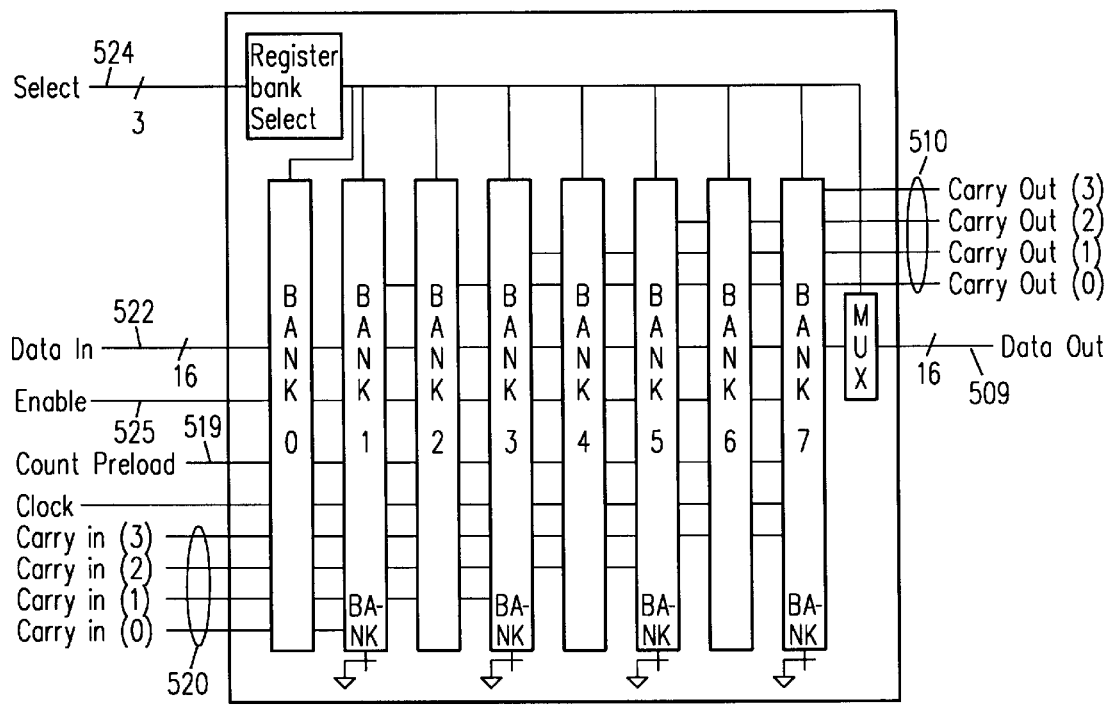
Figures 5, 5B, 6:
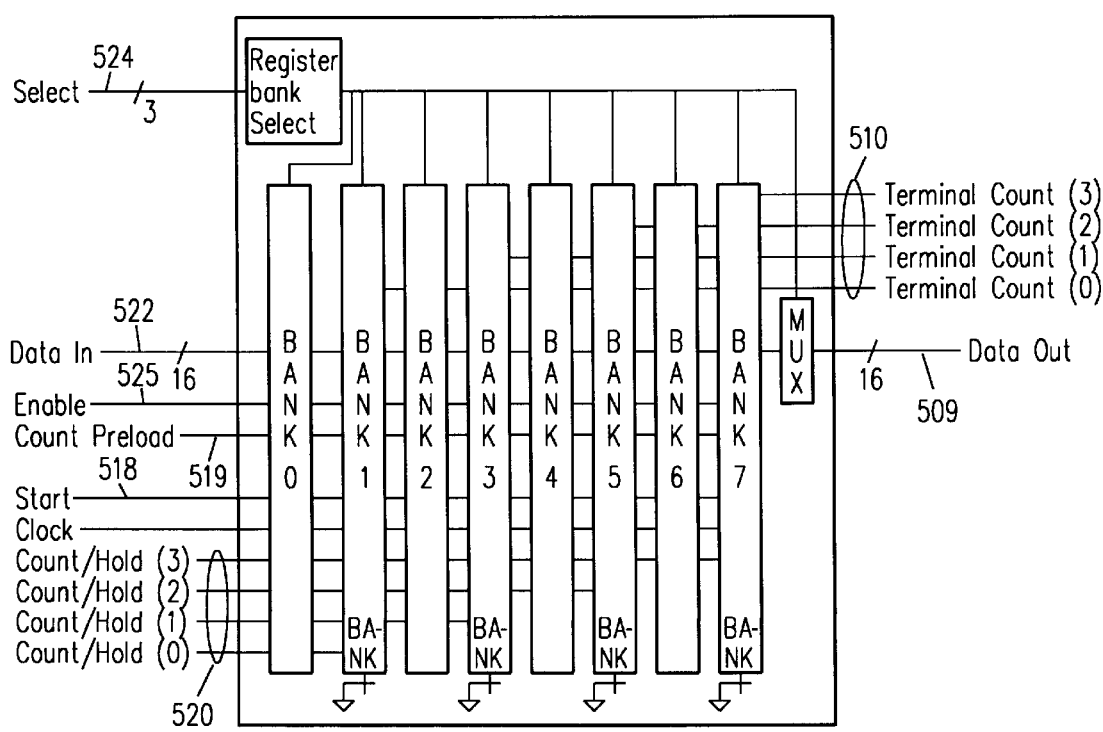

FIGS. 5b(i)–5b(vi) show the various configurations of ASB 500. FIG. 5b(i) shows ASB 500 being configured for parallel data input and parallel data output on busses 523 and 509, respectively. 3-bit select lines 524 select which of the eight 16-bit register banks is addressed. The enable signal on lead 525 enables the data on bus 523 to be written into the selected register bank. In this embodiment, the input bus 523 can be configured to provide true or complement logic format. Complement format is provided by inverted the input signals received from I/O cells 505a–505p by multiplexer 515, or by selecting the inverted output of AND array 570.

FIG. 5b(ii) shows ASB 500 being configured for parallel data input and both parallel and serial data output. Under this configuration, two or more adjacent register banks can be configured to form a shift register of any size between 20–128 bits, at 4-bit increments. Of course, if only one register bank is used, the shift register can be 4-bit, 8-bit, 12-bit or 16-bit. In this configuration, each register bank can be read or loaded in parallel in substantially the same manner as described above with respect to the configuration shown in FIG. 5b(i). The register bank at the most significant end of the shift register can be configured to be a 4-bit, 8-bit, 12-bit or 16-bit shift register slice, with the shift register's remaining register banks each set to be 16-bit wide. In addition, when the shift enable signal on lead 518 is asserted, the bits in the shift register are shifted one bit per clock cycle, with the least significant bit shifted out of the shift register onto serial output lead 508. In this embodiment, priority is given to the enable signal on lead 525, i.e. if both the enable signal on lead 525 and the shift enable signal on lead 518 are asserted, parallel data load of a selected register bank results.

FIG. 5b(iii) shows ASB 500 being configured for both parallel and serial data input and parallel data output. In this embodiment, two or more adjacent register banks can be configured to form a shift register of any size between 20–128 bits, at 4-bit increments. Of course, if only one register bank is used, the shift register can be 4-bit, 8-bit, 12-bit or 16-bit. The register bank at the most significant end of the shift register can be configured as a 4-bit, 8-bit, 12-bit or 16-bit shift register slice, with the shift register's remaining register banks each set to be 16-bit wide. When the shift enable signal on lead 518 is asserted, the bit on serial data input line 523 is shifted into the shift register as the most significant bit. Parallel data read and data write are carried out in substantially the same manner as described above with respect to the configuration of FIG. 5b(i). In this embodiment, as in the configuration of FIG. 5b(ii), the enable signal on lead 525 has priority over the shift enable signal on lead 518.

FIG. 5b(iv) shows ASB 500 configured for both parallel and serial data input and both parallel and serial data output. Under this configuration, two or more adjacent register banks can be configured to form a shift register of any size between 20–128 bits, at 4-bit increment. The register bank at the most significant end of the shift register can be configured to be a 4-bit, 8-bit, 12-bit or 16-bit shift register slice, with the shift register's remaining register banks each set to be 16-bit wide. Of course, if only one register bank is used, the shift register can be 4-bit, 8-bit, 12-bit or 16-bit. When the shift enable signal on lead 518 is asserted, the bit on lead 523 is shifted into the shift register as the most significant bit, and the least significant bit shifted out of the shift register onto lead 508 as a serial data output bit. In this embodiment, as in the configuration of FIG. 5b(ii), the enable signal on lead 525 has priority over the shift enable signal on lead 518.

FIG. 5b(v) shows ASB 500 being configured for counter operations. In this embodiment, counter functions are provided only in register banks 1, 3, 5 and 7. Thus, ASB 500 can be configured into four 4-, 8-, 12-, or 16-bit counters. Alternatively, two or more adjacent register banks can be configured to form a larger up/down counter of any size between 20–64 bits, at 4-bit increments. In such a larger counter, the register bank at the most significant end is configured as a 4-bit, 8-bit, 12-bit or 16-bit counter, with the larger counter's remaining register banks eacg set at 16 bits wide. In this configuration, when the enable signal on lead 525 is asserted, the selected register bank is loaded in parallel. Alternatively, when the count preload signal on lead 519 is asserted, the selected counter loads the content of an adjacent register bank. For example, when the signal on lead 519 is asserted, the counter in register bank 1 loads in parallel the content of register bank 0. When a count "carry in" signal on bus 520 is asserted, depending on whether the counter associated with this count "carry in" signal is programmed to be an up counter or a down counter, the associated counter is incremented or decremented. Also, depending on whether the counter is programmed to be an up counter or a down counter, overflow or underflow condition in each counter is indicated in the corresponding "carry out" signal on bus 510.

FIG. 5b(vi) shows ASB 500 being configured for timer operations. A timer is a counter which does not "wrap" around when the terminal count is reached. In this embodiment, only register banks 1, 3, 5 and 7 can provide with timer functions. As in the counter configuration of FIG. 5b(v), two or more adjacent timers in ASB 500 can be configured to form a timer of any width between 20–64 bits, at 4-bit increments. Alternatively, each timer in ASB 500 can be individually configured as a 4, 8, 12 or 16-bit timer. In this embodiment, at programming time, a preset value can be specified for each timer. When the start signal on lead 518 is set to logic load, the preset value is loaded into the selected counter to perform the timer operations.

Figures 2, 5C:
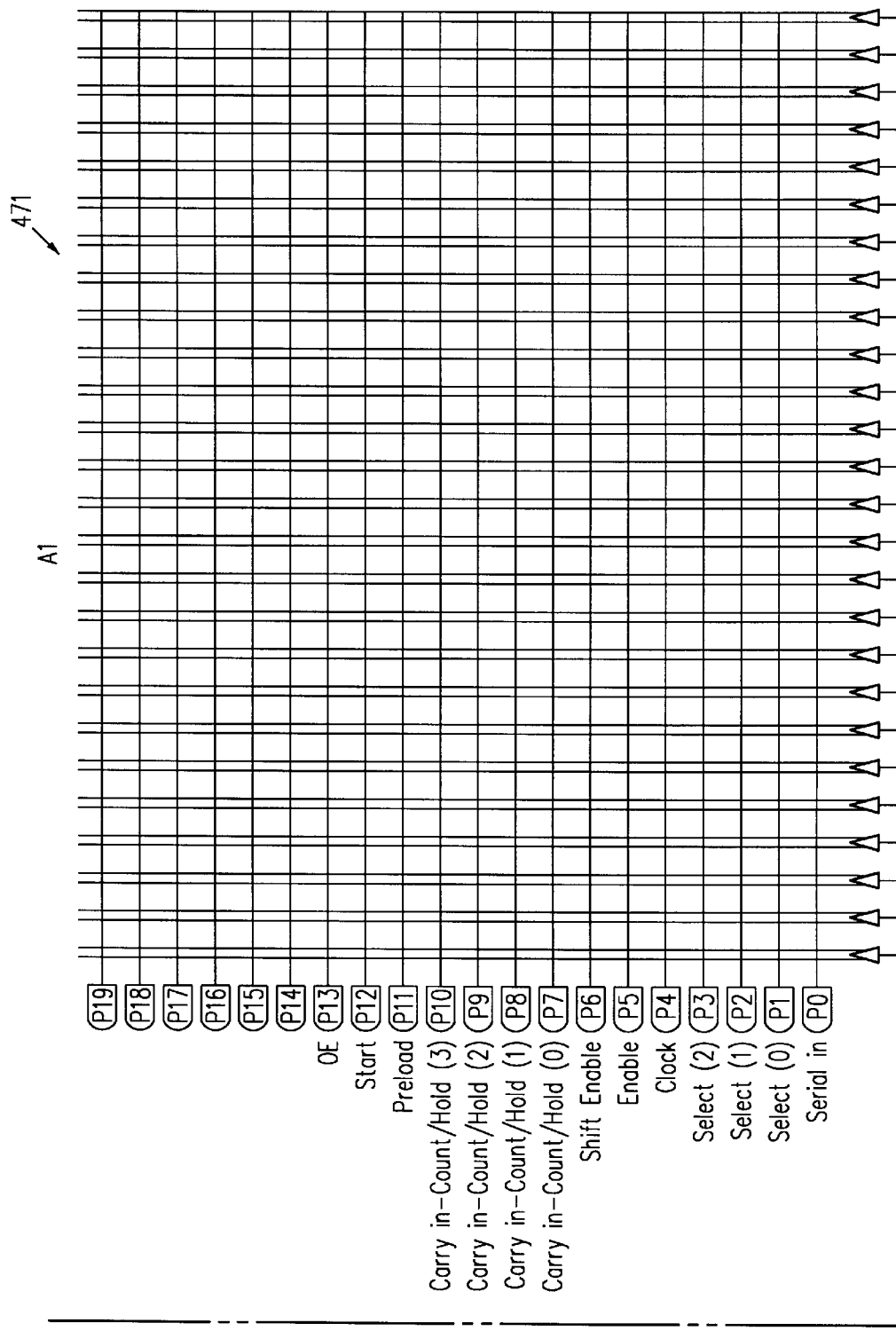
FIG. 5c shows AND arrays 570 and 571 providing the two groups A0 and A1 of interconnect lines routing signals from an LRP to ASB 500 under.

FIG. 5c shows AND arrays 570 and 571 providing the two groups A0 and A1 of interconnect lines routing signals from an LRP to ASB 500. The assignments of the interconnect lines in the groups A0 and A1 are shown in the column on the left of each AND array.

FIG. 5d shows an interface interconnect block (IIB) 590 routing the output signals of ASB 500 into an LRP. As shown in FIG. 5d, each input signal to IIB 590 can be routed to one of four LRP lines.

Figures 1, 6A:
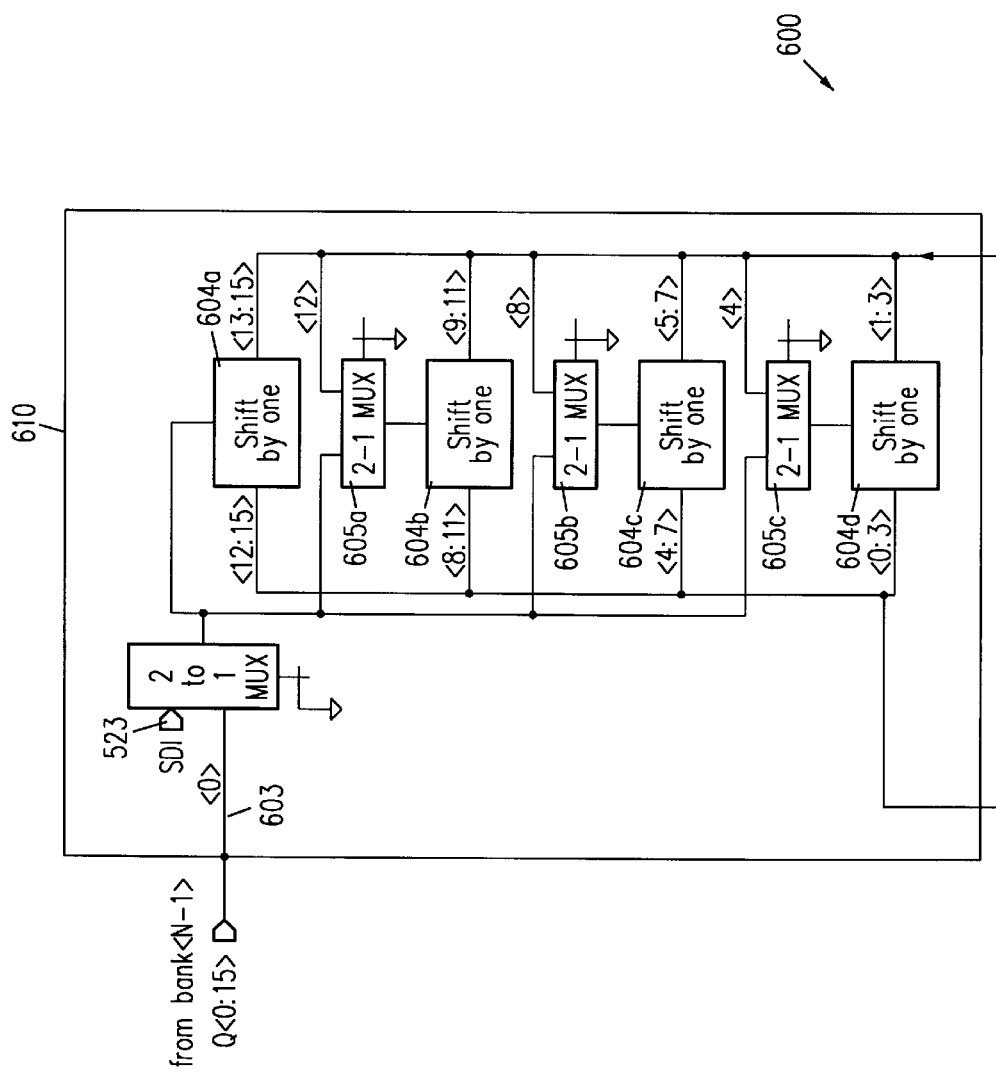
FIG. 6a shows a circuit 600 suitable for implementing one of ASB 500's register banks 0, 2, 4, and 6.
Figures 2, 6A:
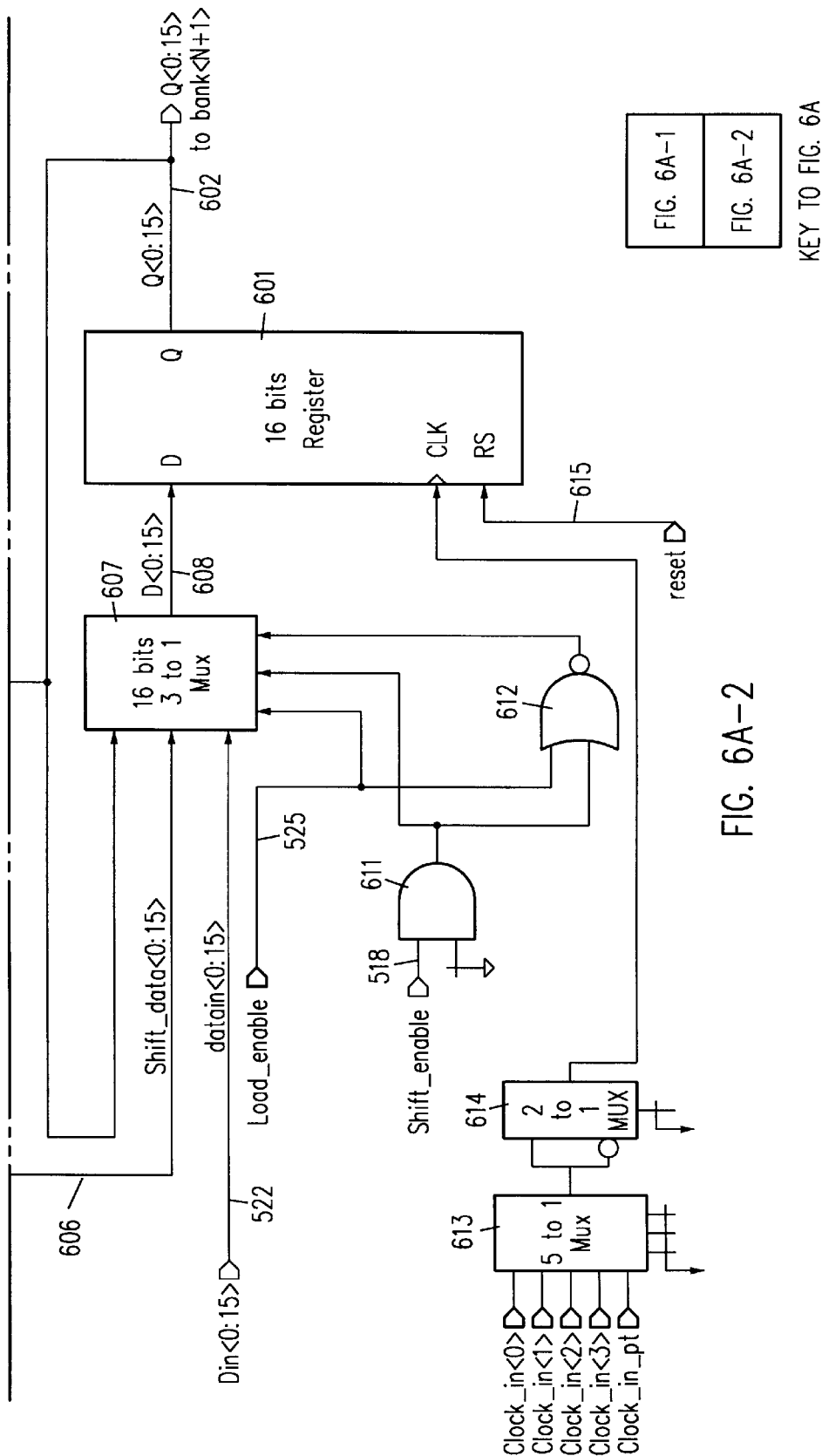

FIG. 6a shows a circuit 600 suitable for implementing one of the register banks 0, 2, 4 and 6 in the present embodiment.

As shown in FIG. 6a, a 16-bit register 601 comprising sixteen D-type flip-flops provides the storage capacity in a register bank. The 16 output signals on bus 602 can be provided to both the common output leads of the register banks (i.e. bus 509 of FIG. 5a) and the input leads of next higher register bank (i.e. if circuit 600 implements register bank 0, the output leads of circuit 600 provides input signals to the input leads of register bank 1). Bus 602 also provides input signals to shift logic block 610. Shift logic block 610 selects as a "serial-in" bit one of (a) the least significant bit on lead 603 from the previous register bank and (b) the signal on lead 523 (FIG. 5a), which is a common serial input pin of the register banks. Under a shift operation, the serial-in bit is inserted at an appropriate 4-bit boundary to the value on output bus 602. For example, if the present register bank is configured as a 12-bit shift register, the serial bit is inserted by multiplexer 605a into bit 11 of the value on bus 602, resulting in the shifted value on bus 606. The remaining 11 bits (i.e. bits 0–11) of the value on bus 606 are obtained by shifting bits 0–11 of bus 602 using the shifters 604b, 604c, and 604d, with multiplexers 605b and 605c set to receive bits 8 and 4 of bus 602 respectively.

The input signals to register 601 are selected by multiplexer 607 from three sources: (a) bus 602, (b) bus 606 and (c) bus 522. The signals of bus 602 are selected when neither the shift enable signal on lead 518, nor the enable signal on lead 525, is asserted. The signals of bus 606 are selected when the shift enable signal on lead 518 is asserted, and the signals on bus 522 are selected when the enable signal on lead 525 is asserted. As shown in FIG. 6a, gates 611 and 612 ensures that the enable signal on lead 525 has priority over the shift enable signal on lead 518.

The clock signal for register 601 is selected from five sources by multiplexer 613. From the clock signal selected by multiplexer 613, multiplexer 614 further selects one of two phases. A global reset signal provided on lead 615 initializes register 601.

Figures 1, 6B:
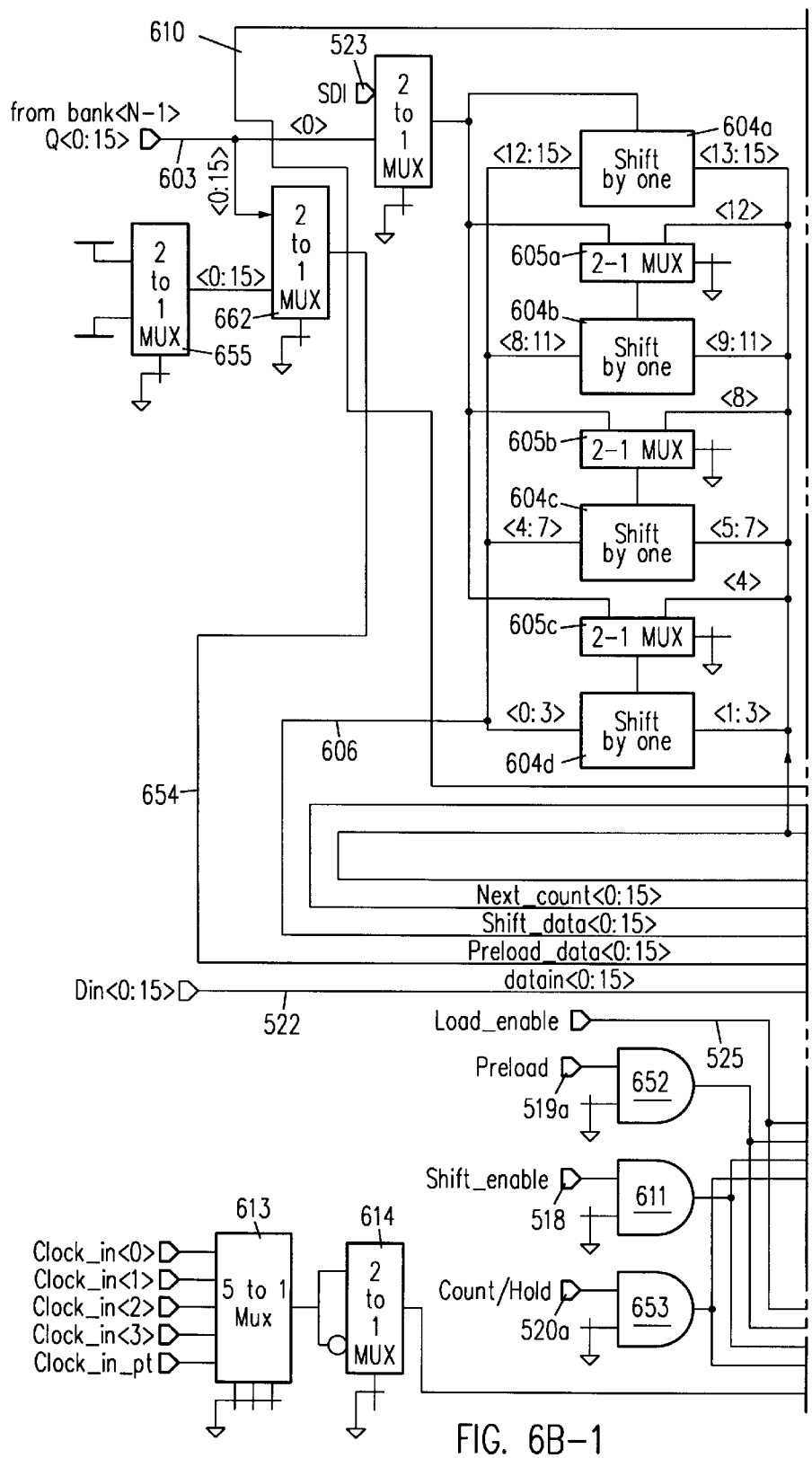
FIG. 6b shows a circuit 650 suitable for implementing one of ASB 500's register banks 1, 3, 5, and 7.
Figures 2, 6B:
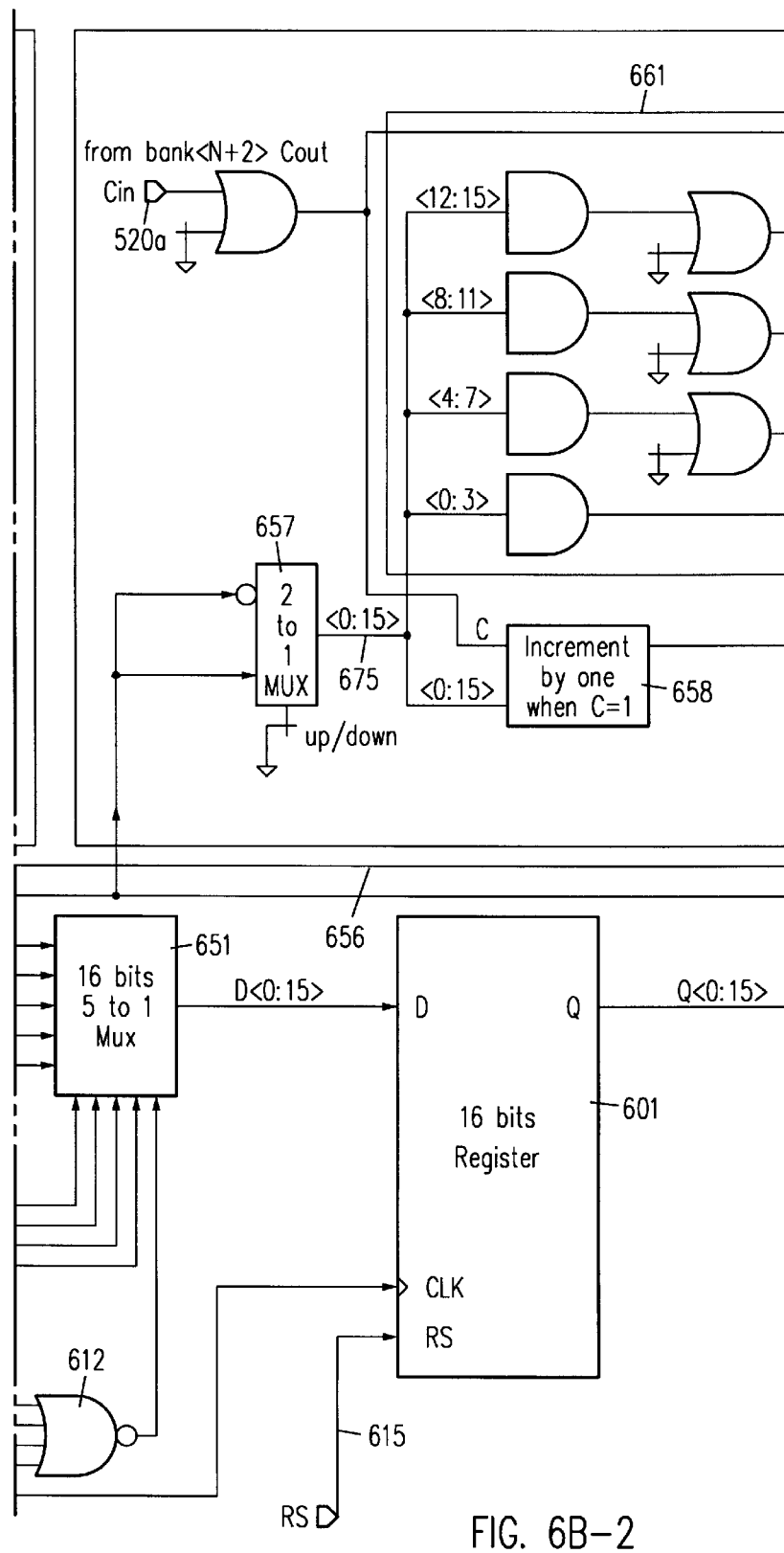
Figures 3, 6B:
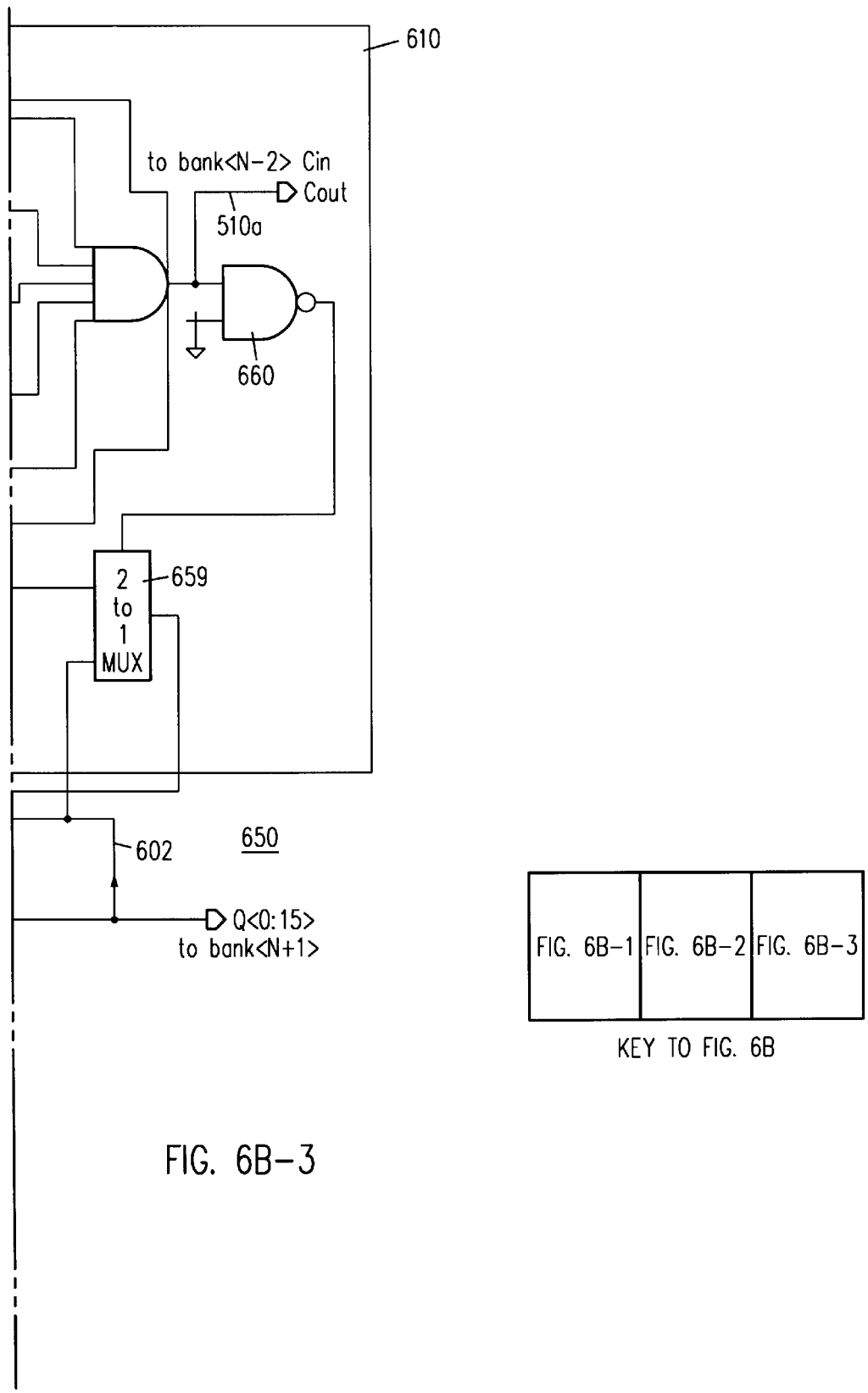

FIG. 6b shows a circuit 650 suitable for implementing one of the register banks 1, 3, 5 and 7 in the present embodiment. To facilitate cross reference between circuits 600 and 650 of FIGS. 6a and 6b, like elements in circuits 600 and 650 are provided the same reference numerals. Thus, it will be appreciated that 16-bit register 601, shift logic 610, and multiplexers 613 and 614 for clock signal selection, are substantially identical in both circuits 600 and 650.

In circuit 650, in addition to receiving input signals from data bus 522, bus 602 and shift bus 606, register 601 can receive from two additional sources of input signals through multiplexer 651. These two additional sources of input signals are the "preload data" on bus 654, and the next count signals on bus 656. The next count signals of bus 656 are the output signals from counter logic 670. Multiplexer 662 selects for preload data bus 654 either the 16-bit data of the previous register bank's output signals received on bus 603, or a preset value configured at programming time by setting multiplexers 655. Multiplexers 655 include 16 two-to-one multiplexers, which are each independently programmed to provide a 16-bit value. The data on bus 654 is selected when the "preload" signal on lead 519a (a bit on bus 519 of FIG. 5a) is asserted.

The "next count" signals on bus 656 are selected when circuit 650 is in either the counter or the timer mode. Depending upon whether multiplexer 657 selects for bus 675 the signals on bus 602, or their complement signals, count logic 670 implements either an up-counter or a down-counter. When the count "carry in" signal on input lead 520a (a bit of bus 520, shown in FIG. 5a) is asserted, incrementer 658 increments the output value from multiplexer 657, and provides on bus 656 as its output value the 16-bit next count signals. Circuit 661 detects the appropriate overflow or underflow condition (i.e. the bits on bus 675 are all "one's"), and provide a "count carry out" signal on lead 510a (a bit of bus 510 in FIG. 5a). When circuit 650 is configured as a timer, the count "carry out" signal becomes the "terminal count" signal. In timer mode, when ther terminal count is reached, gate 660 selects as output signals of multiplexer 659 the signals on bus 602 as the "next count" signals.

The above detailed description is provided to illustrate the specific embodiments of the present invention and is not intended to be limiting. Numerous modifications and variations within the scope of the present invention are possible. The present invention is defined by the following claims.

We claim:

1. A programmable logic integrated circuit, comprising:
   a programmable logic circuit, said programmable logic circuit having programmable logic cells for configuring into a logic circuit;
   a programmable storage circuit, said programmable storage circuit being a storage element module configurable into one of a plurality of predetermined configurations; and
   a programmable interconnection resource for programmably interconnecting said programmable logic circuit and said programmable storage circuit, and
   wherein said programmable interconnection resource further comprises a switch matrix of interconnection lines and said programmable storage circuit comprises a plurality of input and output terminals, said integrated circuit further comprises a programmable interface interconnection block between said programmable storage circuit and said programmable interconnection resource, said programmable interconnection block multiplexes said input and output terminals of said programmable storage circuit onto one or more of said interconnection lines.

2. An integrated circuit as in claim 1, further comprises:
   a plurality of input and output terminals; and
   a programmable input resource for selectively coupling said input terminals of said integrated circuit to said input terminals of said programmable storage circuit, so as to provide input signals to said programmable storage circuit.

3. An integrated circuit as in claim 1, wherein said integrated circuit is in-system programmable.

4. An integrated circuit as in claim 1, wherein said integrated circuit is implemented using a non-volatile memory technology.

5. An integrated circuit as in claim 1, wherein said integrated circuit is implemented using a volatile memory technology.

6. An integrated circuit as in claim 1, wherein said programmable storage circuit comprises a memory array.

7. An integrated circuit as in claim 1, wherein said integrated circuit is in-system programmable.

8. An integrated circuit as in claim 1, wherein said integrated circuit is implemented using a non-volatile memory technology.

9. An integrated circuit as in claim 1, wherein said integrated circuit is implemented using a volatile memory technology.

10. An integrated circuit as in claim 1, wherein said programmable storage circuit comprises a programmably configurable memory array.

11. An integrated circuit as in claim 1, wherein said programmable storage circuit comprises a programmably configurable memory array.

12. An integrated circuit as in claim 1, wherein said programmable storage circuit comprises a programmably configurable memory array.

13. An integrated circuit as in claim 10, wherein said memory array has a programmable word size selected from a plurality of word sizes.

14. An integrated circuit as in claim 10, wherein said memory array can be programmably subdivided into one or more memory arrays.

15. An integrated circuit as in claim 10, wherein said memory array comprises a dual-port memory array.

16. An integrated circuit as in claim 15, further comprising a control circuit for accessing memory words in said dual-port memory array in a first-in-first-out manner.

17. An integrated circuit as in claim 16, further comprising a status signal logic circuit for indicating qualitatively the amount of valid data in said memory array.

18. An integrated circuit as in claim 17, wherein said control circuit comprises a read counter and a write counter for generating addresses to access said dual-port memory array.

19. An integrated circuit as in claim 1, wherein said programmable storage circuit comprises a programmably configurable memory array.

20. An integrated circuit as in claim 19, wherein said memory array has a programmable word size selected from a plurality of word sizes.

21. An integrated circuit as in claim 19, wherein said memory array can be programmably subdivided into one or more memory arrays.

22. An integrated circuit as in claim 19, wherein said memory array comprises a dual-port memory array.

23. An integrated circuit as in claim 19, further comprising a control circuit for accessing memory words in said dual-port memory array in a first-in-first-out manner.

24. An integrated circuit as in claim 20, further comprising a status signal logic circuit for indicating qualitatively the amount of valid data in said memory array.

25. An integrated circuit as in claim 24, wherein said control circuit comprises a read counter and a write counter for generating addresses to access said dual-port memory array.

26. An integrated circuit as in claim 1, wherein said programmable storage circuit comprises a plurality of registers.

27. An integrated circuit as in claim 26, wherein said programmable storage circuit further comprises a logic configuration circuit for configuring one of said registers into a shift register.

28. An integrated circuit as in claim 26, wherein said programmable storage circuit further comprises a logic configuration circuit for configuring one of said registers into a counter.

29. An integrated circuit as in claim 26, wherein said programmable storage circuit further comprises a logic configuration circuit for configuring one of said registers into a timer.

30. An integrated circuit as in claim 1, wherein said programmable storage circuit comprises a plurality of registers.

31. An integrated circuit as in claim 1, wherein said programmable storage circuit comprises a plurality of registers.

32. An integrated circuit as in claim 1, wherein said programmable storage circuit comprises a plurality of registers.

33. An integrated circuit as in claim 31, wherein said programmable storage circuit further comprises a logic configuration circuit for configuring one of said registers into a shift register.

34. An integrated circuit as in claim 31, wherein said programmable storage circuit further comprises a logic configuration circuit for configuring one of said registers into a counter.

35. An integrated circuit as in claim 31, wherein said programmable storage circuit further comprises a logic configuration circuit for configuring one of said registers into a timer.

36. An integrated circuit as in claim 1, wherein said programmable storage circuit comprises a plurality of counters.

37. An integrated circuit as in claim 1, wherein said programmable storage circuit comprises a plurality of counters.

38. An integrated circuit as in claim 1, wherein said programmable storage circuit comprises a plurality of counters.

39. An integrated circuit as in claim 35, said timer coupled to receive an initial value from a source external to said integrated circuit.

40. An integrated circuit as in claim 35, said timer coupled to receive an initial value from another of said registers.

41. An integrated circuit as in claim 35, said timer coupled to receive a programmable load value.

* * * * *